US010418226B2

(12) United States Patent
Watanabe et al.

(10) Patent No.: US 10,418,226 B2
(45) Date of Patent: Sep. 17, 2019

(54) ACTIVATED GAS GENERATION APPARATUS

(71) Applicant: TOSHIBA MITSUBISHI-ELECTRIC INDUSTRIAL SYSTEMS CORPORATION, Chuo-ku (JP)

(72) Inventors: Kensuke Watanabe, Tokyo (JP); Shinichi Nishimura, Tokyo (JP); Yoshihito Yamada, Tokyo (JP)

(73) Assignee: TOSHIBA MITSUBISHI-ELECTRIC INDUSTRIAL SYSTEMS CORPORATION, Chuo-ku (JP)

( * ) Notice: Subject to any disclaimer, the term of this patent is extended or adjusted under 35 U.S.C. 154(b) by 0 days.

(21) Appl. No.: 16/098,038

(22) PCT Filed: May 27, 2016

(86) PCT No.: PCT/JP2016/065658
§ 371 (c)(1),
(2) Date: Oct. 31, 2018

(87) PCT Pub. No.: WO2017/702367
PCT Pub. Date: Nov. 30, 2017

(65) Prior Publication Data
US 2019/0157046 A1 May 23, 2019

(51) Int. Cl.
*H01J 37/32* (2006.01)
*H05H 1/42* (2006.01)

(52) U.S. Cl.
CPC .. *H01J 37/32449* (2013.01); *H01J 37/32036* (2013.01); *H01J 37/32568* (2013.01); *H01J 37/32715* (2013.01)

(58) Field of Classification Search
None
See application file for complete search history.

(56) References Cited

U.S. PATENT DOCUMENTS

2003/0019580 A1* 1/2003 Strang ............... C23C 16/45565
156/345.33
2014/0123897 A1* 5/2014 Tabata ............. H01J 37/32348
118/723 E

FOREIGN PATENT DOCUMENTS

| JP | 2537304 | B2 | 9/1996 |
| JP | 11-335868 | A | 12/1999 |
| JP | 3057065 | B2 | 6/2000 |

(Continued)

OTHER PUBLICATIONS

International Search Report dated Aug. 16, 2016 in PCT/JP2016/065658 filed May 27, 2016.

*Primary Examiner* — Dedei K Hammond
(74) *Attorney, Agent, or Firm* — Oblon, McClelland, Maier & Neustadt, L.L.P.

(57) ABSTRACT

An activated gas generation apparatus includes a gas jet flow straightener below an activated gas generating electrode group and a nozzle constituent part. The gas jet flow straightener receives a plurality of nozzle passing activated gases as a whole at an inlet part of a gas flow-straightening passage. The gas flow-straightening passage is formed so that the outlet opening area of an outlet part is set to be narrower than the inlet opening area of the inlet part, and the cylindrical gas jet of each of the plurality of nozzle passing activated gases is converted into a linear flow-straightened activated gas by the flow-straightening action of the gas flow-straightening passage.

7 Claims, 23 Drawing Sheets

(56) References Cited

FOREIGN PATENT DOCUMENTS

| | | |
|---|---|---|
| JP | 2003-129246 A | 5/2003 |
| JP | 5158084 B2 | 3/2013 |
| JP | 5328685 B2 | 10/2013 |

\* cited by examiner

F I G. 15
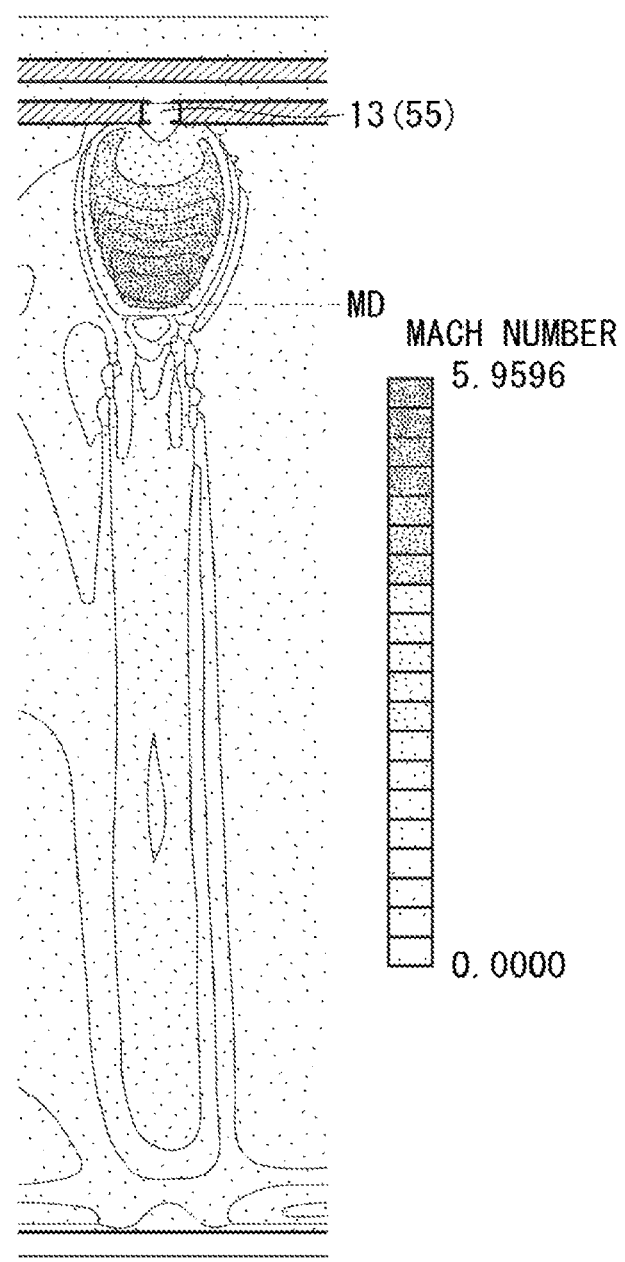

ACTIVATED GAS GENERATION APPARATUS

TECHNICAL FIELD

The present invention relates to an activated gas generation apparatus for generating an activated gas obtained by utilizing a discharge phenomenon from a source gas.

BACKGROUND ART

In a conventional activated gas generation apparatus, a metal electrode such as an Au film may be formed on a dielectric electrode containing ceramics or the like as a constituent material to form an electrode constituent part. In such an apparatus, the dielectric electrode in the electrode constituent part is a main component, and the metal electrode formed thereon is dependent.

One of the conventional activated gas generation apparatuses is a activated gas generation apparatus in which a disk-shaped electrode constituent part is used; and a source gas penetrating from an outer peripheral part to an inside passes through a discharge space (discharge field), and is sprayed from only one gas spray hole provided in a central part of the electrode to an outside.

Conventional activated gas generation apparatuses including the above-described apparatuses are disclosed, for example, in Patent Document 1, Patent Document 2, Patent Document 3, and Patent Document 4.

In the activated gas generation apparatus disclosed in Patent Document 1, discharge is generated between cylindrical electrodes formed inside and outside a cylinder, and a source gas is introduced between the electrodes to generate an activated gas (radical-containing gas). The flow path of the activated gas is squeezed by a blowout port provided at the tip of the cylinder to spray a plasma jet. The plasma jet treats an object to be treated set immediately therebelow.

In the activated gas generation apparatus disclosed in Patent Document 2, a pair of opposing electrodes are provided in a flat plate form, and set in a vertical form, so that a gas is supplied into the electrodes from the upper side toward the lower side, to treat an object to be treated set immediately below. The activated gas generation apparatus having a flat plate electrode structure is comparatively easily grown in size, which enables a uniform film formation treatment to a large area. The similar treatment apparatus in which the pair of opposed flat plate electrodes are set in a vertical form is used for many other applications such as Patent Document 5 or the like, including not only film formation treatment applications but also surface treatment applications. There is also an apparatus using an apparatus structure in which a plurality of pairs of opposing electrodes are stacked and disposed instead of one pair of opposing electrodes (Patent Document 6).

In the activated gas generation apparatus disclosed in Patent Document 3, a pair of opposing disk-shaped electrodes are provided; a large number of pores are formed in a shower plate form in a ground side electrode among the pair of opposing disk-shaped electrodes; and a discharge part is directly connected to a treatment chamber. The electrodes are enlarged, or a plurality of electrodes themselves are provided, and numerous pores are provided, which can provide uniform large-area nitriding. The discharge space (discharge field) itself is near the atmospheric pressure, while the treatment chamber is placed in further reduced pressure state via the pores. As a result, the activated gas generated in the discharge field is transported under reduced pressure via the pores immediately after generation, to minimize its attenuation, so that the activated gas can arrive at the object to be treated in a higher density state.

In the activated gas generation apparatus disclosed in Patent Document 4, a pair of opposing electrodes having a rectangular flat plate shape are provided; gaps are blocked by spacers on three sides; and the gas is sprayed toward one direction in which a gap is opened. A gas spray hole is provided at the tip of the opening part, to blow an activated gas (radical) onto an object to be treated.

PRIOR ART DOCUMENTS

Patent Documents

Patent Document 1: Japanese Patent No. 3057065
Patent Document 2: Japanese Patent Application Laid-Open No. 2003-129246
Patent Document 3: Japanese Patent No. 5328685
Patent Document 4: Japanese Patent No. 5158084
Patent Document 5: Japanese Patent Application Laid-Open No. 11-335868 (1999)
Patent Document 6: Japanese Patent No. 2537304

SUMMARY

Problem to be Solved by the Invention

In the method for generating the activated gas disclosed in Patent Document 1, the opening part of the blowout port has a diameter of several millimeters, so that a treatment area is extremely limited.

As the activated gas generation apparatus disclosed in Patent Document 1, there is also proposed a configuration in which electrodes are set in a lateral direction, and a plurality of blowout ports are provided along the electrodes. This method can provide a large treatment area. However, the method causes complicated shapes and structures of the cylindrical body and electrode. Considering semiconductor film formation treatment applications which do not permit atmosphere commingling or the like, component connecting parts are required to have sufficient sealing characteristics. A temperature near the discharge space (discharge field) is high, which makes it necessary to separate a high temperature site from a seal material to some extent in order to have a margin even if cooling is performed. Accordingly, this is expected to cause a considerable apparatus size.

In the activated gas generating methods disclosed in Patent Document 2, Patent Document 5, and Patent Document 6, both the discharge space (discharge field) and the object to be treated are basically treated under the same pressure near the atmospheric pressure. The activated gas reacts with others because of its high energy state, or is apt to be easily deactivated by light emission or the like. Since the collision frequency increases as the pressure increases, it is desirable that the generated activated gas is rapidly transferred to reduced pressure even though a pressure state equal to or higher than a certain level cannot be avoided for the sake of expediency of the discharge method in the discharge field. From such a viewpoint, it is conceivable that, in the method disclosed in Patent Document 2 or the like, the radical density has been considerably attenuated when the activated gas arrives at the object to be treated.

In contrast, when the activated gas generation method disclosed in Patent Document 2 or the like is executed under a pressure lower than the atmospheric pressure, it is necessary to set also a discharge electrode in a vacuum treatment chamber, so that the apparatus is disadvantageously enlarged. Furthermore, in order to obtain discharge power from the decrease of a discharge starting voltage caused by the pressure decrease, it is necessary to provide a higher frequency. In this case, charged particles such as ions are trapped between the electrodes, and transported as it is to the object to be treated. This disadvantageously causes breakage due to charge-up.

On the other hand, in the activated gas generation method disclosed in Patent Document 3, the pores also serve as an orifice, which makes it necessary to make the total pore cross-sectional area coincide with a cross-sectional area necessary for maintaining a predetermined pressure difference, and makes it impossible to increase the number of the pores to the same extent as that of an original shower plate for a semiconductor film formation treatment. When the number of the pores is small, the difference in gas flow rate according to the arrangement on the electrode is increased, and the flow rate difference for each pore leads directly to the flux of the activated gas, so that unevenness occurs in the film thickness unless the flow rate difference is accurately grasped, and film treatment conditions are accordingly set. The gas advances from the disk-shaped outer peripheral part into the electrodes, and is released from the pores formed in the discharge field to the outside. This naturally causes a difference between the radical density (activated gas density) in the gas penetrating into the discharge field and immediately released from the pores and the radical density in the gas disposed on the innermost side and passing through the discharge field over a sufficiently long period of time, and thereafter released, so that a synergistic effect with the difference of gas flow rate makes it extremely difficult to provide a uniform film formation condition.

In contrast, although not described in Patent Document 3, it is also conceivable to introduce an activated gas via a shower plate after causing the activated gas to pass through an orifice once. For example, only one hole serving as an orifice is formed in the central part of a circular electrode. A pressure difference is formed by only this one orifice. The shower plate is provided immediately below the orifice, and the activated gas is diffused over a wide range in an environment having a pressure reduced to a film formation treatment pressure.

In this case, since the arrangement pitch of shower plate pores can surely be made small, the uniform diffusibility of the gas itself to an object to be treated is remarkably improved. Since the number of the orifices is only one stage, unlike the case of a multi-stage orifice using a plurality of orifices, the gas which has left a discharge field is immediately guided to a low pressure region, so that the attenuation of radicals can be suppressed. In this method, however, the gas jets sprayed from the orifice spread in the plate while repeatedly colliding with the inner wall surface of the shower plate. Since the deactivation of the radicals is accelerated by the collision of the radicals with the objects and the contact of the radicals with the surface for a long time, it is expected that the amount of the radicals markedly decreases when coming out from the shower plate after all. Therefore, it is considered that the above-described method via the shower plate is not a fundamental solution for the attenuation of the density of the radicals.

In the activated gas generation apparatus disclosed in Patent Document 4, the gas spray holes are required to function as an orifice in order to provide the following pressure section: the discharge field is set to be near the atmospheric pressure; and a treatment chamber in which the object to be untreated is set under reduced pressure. The electrode constituting the discharge field and the part having the gas spray holes constituting the orifice are different from each other, which requires positioning mechanisms for the electrode and the part. In order to prevent the occurrence of the gap in parts other than the gas spray holes, a sealing mechanism is also required to be provided. Considering the constitution as described above, the apparatus is expected to be extremely complicated.

As described above, in the conventional activated gas generation apparatuses disclosed in Patent Document 1, Patent Document 2, and Patent Document 4 or the like, a region which can be subjected to a film formation treatment is relatively limited to a case of one gas spray hole, and a case of a line-like gas spray hole, or the like. In particular, it is completely impossible to uniformly treat a wafer having a diameter $\phi$ of 300 mm. Meanwhile, as in the activated gas generation apparatus disclosed in Patent Document 3, there is means of attaching a shower plate for gas diffusion behind the gas spray holes. However, originally, the activated gas is very highly active, so that the activated gas advances in the shower plate while colliding with the wall surface of the plate, to deactivate most of radicals (activated gas), which causes a serious problem that the activated gas generation apparatus cannot withstand practical use.

It is an object of the present invention to solve the above problems and to provide an activated gas generation apparatus capable of uniformly generating a high-density activated gas at a relatively high speed.

Means to Solve the Problem

An activated gas generation apparatus according to the present invention includes: a substrate accommodating part for accommodating a substrate to be treated; an activated gas generating electrode group including first and second electrode constituent parts and spraying an activated gas obtained by utilizing a discharge phenomenon from a source gas from a plurality of gas spray holes discretely formed in the second electrode constituent part, wherein each of the plurality of gas spray holes functions as a first restricting cylinder formed in a circular opening cross-sectional shape with a first diameter in plan view; and the first diameter is set so that a pressure difference between a primary pressure before passing through the gas spray holes and a secondary pressure after passing is equal to or higher than a predetermined pressure ratio; a nozzle constituent part including a plurality of nozzle parts provided to correspond to the plurality of gas spray holes of the activated gas generating electrode group one-on-one, each of the nozzle parts causing the activated gas sprayed from each of the plurality of gas spray holes to pass therethrough, to obtain the nozzle passing activated gas; and a gas jet flow straightener including an inlet part receiving the plurality of nozzle passing activated gases passing through the nozzle constituent part, and injecting the flow-straightened activated gas toward the substrate to be treated, from an outlet part according to a flow-straightening action causing the plurality of nozzle passing activated gases to pass through gas flow-straightening passages, wherein each of the plurality of nozzle parts includes a second restricting cylinder formed in a circular opening cross-sectional shape with a second diameter in plan view and supplying the activated gas supplied from the first restricting cylinder toward the gas jet flow straightener; the second diameter is set to be longer than the first diameter, and the nozzle passing activated gases are cylindrical gas jets; and the gas flow-straightening passage is formed so that an outlet opening area of the outlet part is set to be narrower than an inlet opening area of the inlet part, and cylindrical gas jets of the plurality of nozzle passing activated gases are converted into the linear flow-straightened activated gas along a predetermined direction by the flow-straightening action.

Effects of the Invention

Since the activated gas generating electrode group of the activated gas su generation apparatus according to the present invention has a plurality of gas spray holes each functioning as a first restricting cylinder having a first diameter, directivity can be imparted to the generated activated gas, as a result of which the activated gas can be supplied at an ultrahigh speed exceeding Mach. In this case, the presence of the second restricting cylinder of the nozzle part provided downstream of the first restricting cylinder makes it possible to suppress a Mach disk phenomenon which causes the extreme deceleration of the sprayed activated gas depending on the impact pressure and the temperature state caused by the ultrahigh speed of the activated gas passing through the first restricting cylinder.

Furthermore, in the gas flow-straightening passage of the gas jet flow straightener, the outlet opening area is set to be narrower than the inlet opening area, and the cylindrical gas jets of the plurality of nozzle passing activated gases are converted into the linear flow-straightened activated gas along the predetermined direction according to the flow-straightening action. For this reason, it is possible to spray the linear flow-straightened activated gas having high uniformity toward the substrate to be treated.

As a result, the activated gas generation apparatus according to the present invention described in the first aspect exhibits an effect of being capable of supplying the activated gas having high uniformity to the substrate to be treated at a relatively high speed.

The objects, features, aspects, and advantages of the present invention will become more apparent from the following detailed description and the accompanying drawings.

BRIEF DESCRIPTION OF DRAWINGS

FIG. 15 is an illustration diagram schematically showing a speed condition of the gas jet in a conventional configuration.

DESCRIPTION OF EMBODIMENTS

Embodiment 1

(Overall Configuration)

Figure 1:
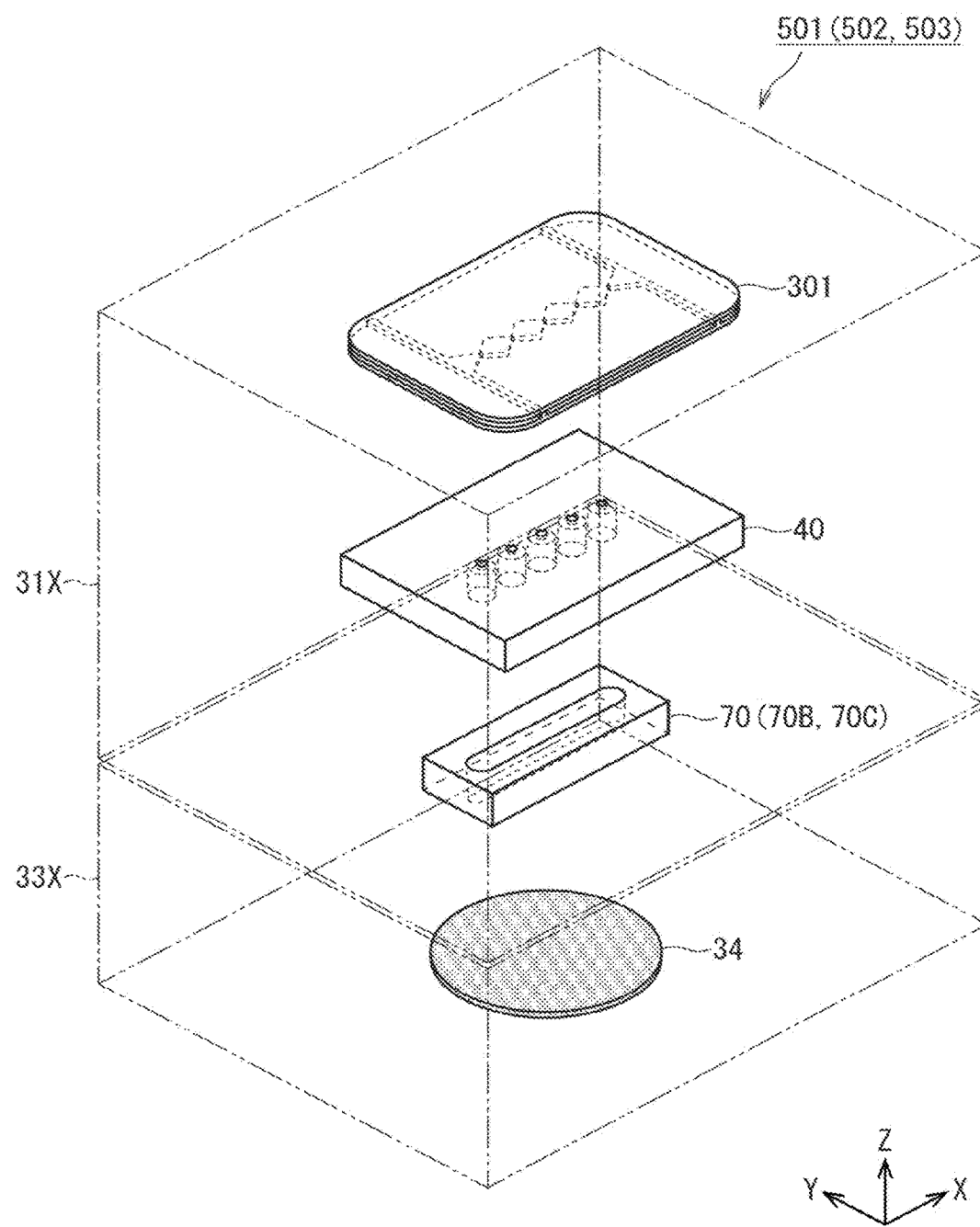
FIG. 1 is an illustration diagram schematically showing an overall configuration of an activated gas generation apparatus according to an embodiment 1 of the present invention.

FIG. 1 is an illustration diagram schematically showing an overall configuration of an activated gas generation apparatus 501 according to an embodiment 1 of the present invention.

As shown in FIG. 1, an activated gas generation apparatus 501 according to the embodiment 1 is configured by disposing a generator housing 31X on a treatment chamber housing 33X. An activated gas generating electrode group 301 and a nozzle constituent part 40 are disposed in the generator housing 31X. A wafer 34 which is a substrate to be treated is disposed below the treatment chamber housing 33X. A gas jet flow straightener 70 is provided in a boundary region between the generator housing 31X and the treatment chamber housing 33X.

Figure 2:
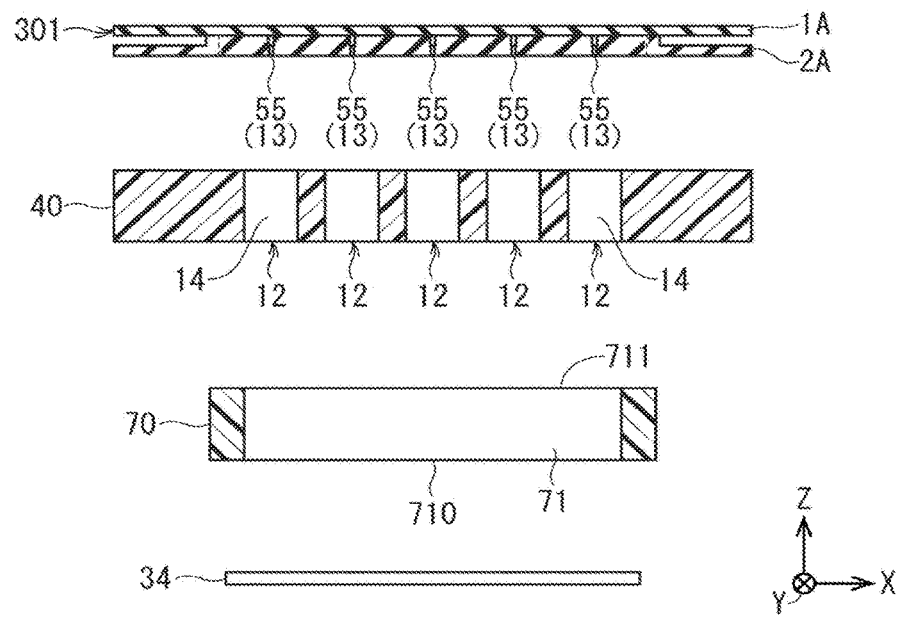
FIG. 2 is an illustration diagram showing schematic configurations of an activated gas generating electrode group, a nozzle constituent part, and a gas jet flow straightener, which serve as a main part according to the embodiment 1 shown in FIG. 1.
Figure 3:
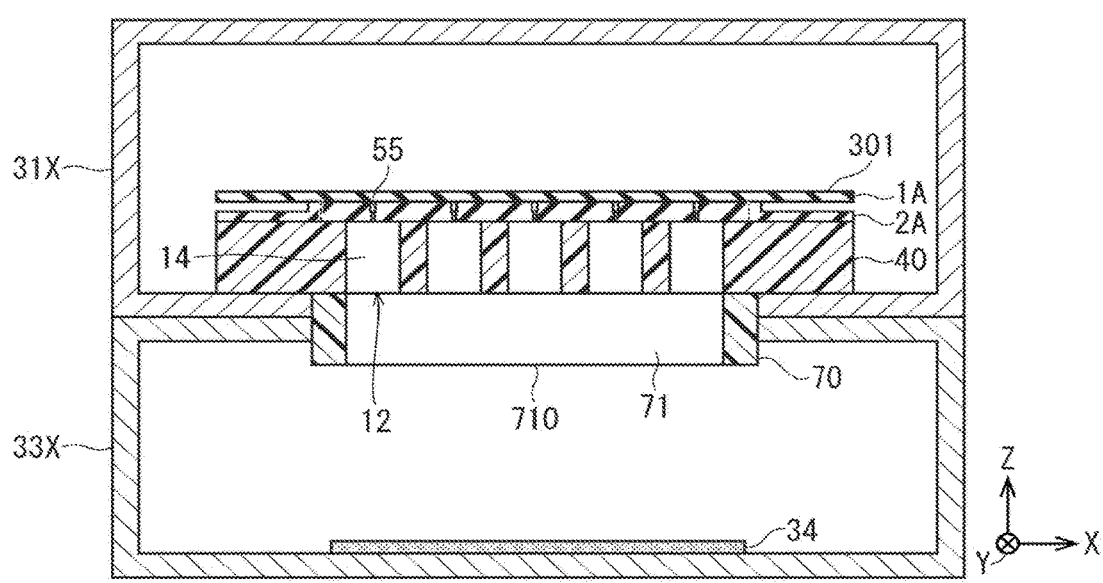
FIG. 3 is an illustration diagram schematically showing a cross-sectional structure of the activated gas generation apparatus.

FIG. 2 is an illustration diagram showing schematic configurations of the activated gas generating electrode group 301, the nozzle constituent part 40, and the gas jet flow straightener 70, which become as a main part of the activated gas generation apparatus 501 according to the embodiment 1. FIG. 3 is an illustration diagram schematically showing a cross-sectional structure of the activated gas generation apparatus 501. In FIGS. 2 and 3, regarding the activated gas generating electrode group 301, the illustrations of metal electrodes 201H and 201L and metal electrodes 101H and 101L, which will be described later, are simplistically omitted as appropriate.

With reference to these figures, the overall configuration of the activated gas generation apparatus 501 will be described. The treatment chamber housing 33X accommodates the wafer 34 which is a substrate to be treated in a state where the wafer 34 is placed on a bottom surface, and functions as a substrate accommodating part for accommodating the wafer 34 in a space.

The activated gas generating electrode group 301 includes a high-voltage side electrode constituent part 1A and a ground side electrode constituent part 2A. The activated gas generating electrode group 301 obtains an activated gas utilizing a discharge phenomenon from a source gas, and sprays the activated gas from a plurality of gas spray holes 55 discretely formed in the ground side electrode constituent part 2A.

The nozzle constituent part 40 includes a plurality of nozzle parts 12, and the plurality of nozzle parts 12 are provided to correspond to the plurality of spray holes 55 of the activated gas generating electrode group 301 one-on-one. The activated gas sprayed from each of the plurality of gas spray holes 55 is caused to pass through each of the nozzle parts, to obtain a nozzle passing activated gas.

The gas jet flow straightener 70 receives the plurality of nozzle passing activated gases passing through the nozzle constituent part 40 as a whole at an inlet part 711 provided on an upper surface. According to a flow-straightening action causing the plurality of nozzle passing activated gas to pass through the gas flow-straightening passage 71, the flow-straightened activated gas is injected from an outlet part 710 provided on the lower surface toward the lower wafer 34.

Each of the plurality of gas spray holes 55 provided in the ground side electrode constituent part 2A of the activated gas generating electrode group 301 is formed in a circular opening cross-sectional shape with a first diameter (diameter r1) in plan view, and functions as a first stage restricting cylinder (first restricting cylinder) 13 for supplying the activated gas downward.

In contrast, each of the plurality of nozzle parts 12 is formed in a circular opening cross-sectional shape with a second diameter (diameter r2) in plan view, and includes a second stage restricting cylinder (second restricting cylinder) 14 supplying the activated gas supplied from the first stage restricting cylinder 13 (gas spray hole 55) toward the inlet part 711 of the gas jet flow straightener 70.

The diameter r1 which is the first diameter of the gas spray hole 55 functioning as the first stage restricting cylinder 13 is set so that a pressure difference between a primary pressure inside the generator housing 31X and a secondary pressure inside the treatment chamber housing 33X is equal to or higher than a predetermined pressure ratio. That is, the gas spray hole 55 is configured as an orifice, and is set so that the pressure difference between the primary pressure before passing through the gas spray hole 55 and the secondary pressure after passing is equal to or higher than a predetermined pressure ratio.

In contrast, the diameter r2 which is the second diameter of the second stage restricting cylinder 14 of the nozzle part 12 is set to be longer than the diameter r1 of the first stage restricting cylinder 13. As a result, each of the plurality of nozzle passing activated gases is a cylindrical gas jet.

The gas flow-straightening passage 71 of the gas jet flow straightener 70 is set so that the outlet opening area of the outlet part 710 is narrower than the inlet opening area of the inlet part 711, and formed so that the cylindrical gas jets of the plurality of nozzle passing activated gases are converted into linear flow-straightened activated gas along an X direction (predetermined direction) according to the above-mentioned flow-straightening action.

(Activated Gas Generating Electrode Group 301)

(Presupposition Technique of Activated Gas Generating Electrode Group 301)

Figure 12:
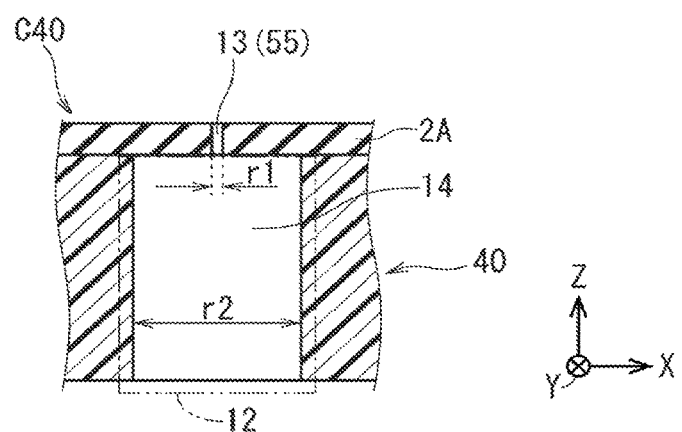
FIG. 12 is an illustration diagram showing cross-sectional structures of a nozzle part and its surrounding in a nozzle constituent part of an activated gas generation apparatus according to an embodiment of the present invention.
Figure 29:
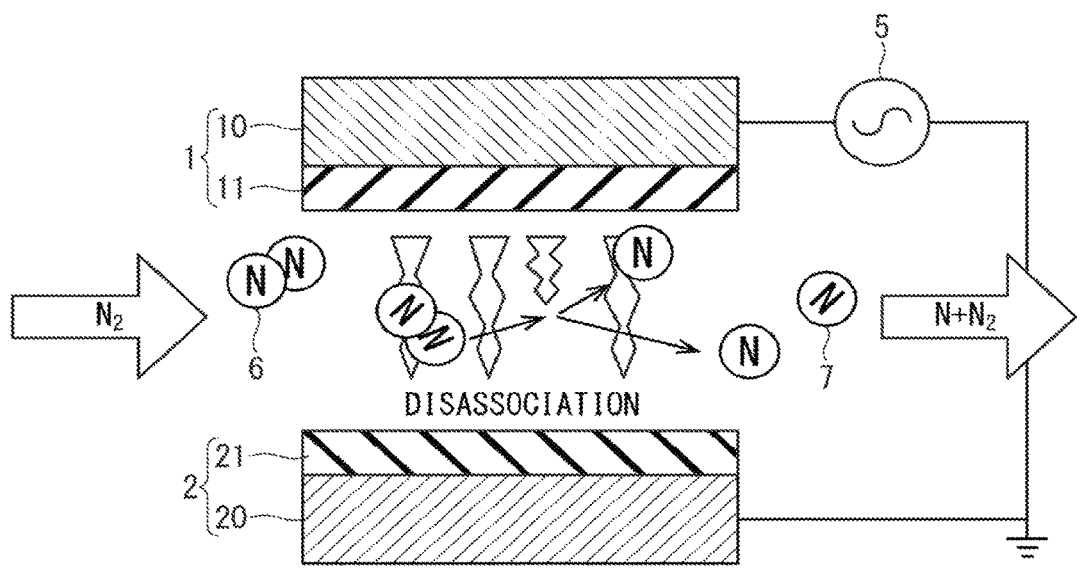
FIG. 29 is an illustration diagram schematically showing a basic configuration of an activated gas generating electrode group according to the present embodiment.

FIG. 29 is an illustration diagram schematically showing a basic configuration of the activated gas generating electrode group 301 in the activated gas generation apparatus 501 of the present invention. As shown in FIG. 12, the activated gas generation apparatus includes, as the basic configuration, a high-voltage side electrode constituent part 1 (first electrode constituent pert), a ground side electrode constituent part 2 (second electrode constituent part) provided below the high-voltage side electrode constituent part 1, and a high frequency power supply 5 (AC power supply part) for applying an AC voltage to the high-voltage side electrode constituent part 1 and the ground side electrode constituent part 2.

The high-voltage side electrode constituent part 1 includes a dielectric electrode 11 (first dielectric electrode)

and a metal electrode 10 (first metal electrode) selectively formed on the upper surface of the dielectric electrode 11. The ground side electrode constituent part 2 includes a dielectric electrode 21 (second dielectric electrode) and a metal electrode 20 (second metal electrode) selectively formed on the bottom surface of the dielectric electrode 21. The metal electrode 20 of the ground side electrode constituent part 2 is connected to the ground level, and the AC voltage is applied from the high frequency power supply 5 to the metal electrode 10 of the high-voltage side electrode constituent part 1.

By the application of the AC voltage of the high frequency power supply 5, a region where the metal electrodes 10 and 20 overlap with each other in plan view is defined as a discharge space in a dielectric space where the dielectric electrodes 11 and 21 face each other. A first activated gas generating part is achieved by the above-described high-voltage side electrode constituent part 1, ground side electrode constituent part 2, and high frequency power supply 5.

In such a configuration, the discharge space is formed between the high-voltage side electrode constituent part 1 and the ground side electrode constituent part 2 by the application of the AC voltage by the high frequency power supply 5, and a source gas 6 such as nitrogen molecules is supplied into the discharge space, to allow an activated gas 7 such as radicalized nitrogen atoms or the like to be obtained.

Figure 30:
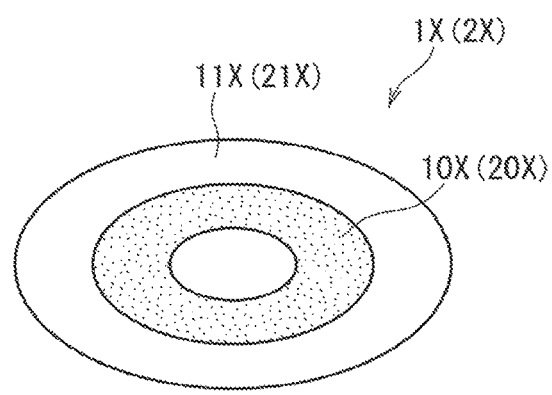
FIG. 30 is an illustration diagram showing a specific configuration example of a high-voltage side electrode constituent part of FIG. 29.

FIG. 30 is an illustration diagram showing a specific configuration example of the high-voltage side electrode constituent part 1. A high-voltage side electrode constituent part 1X which is one specific example of the high-voltage side electrode constituent part 1 is constituted by selectively forming a metal electrode 10X having a ring shape in plan view on the upper surface of a dielectric electrode 11X having a circular shape in plan view. A ground side electrode constituent part 2X which is one specific example of the ground side electrode constituent part 2 is constituted by selectively forming a metal electrode 20X having a ring shape in plan view on the bottom surface of a dielectric electrode 21X having a circular shape in plan view (upside down in FIG. 30). That is, the ground side electrode constituent part 2X is formed so as to have similar configuration as that of the high-voltage side electrode constituent part 1X except that a vertical relationship between the metal electrode 20X and the dielectric electrode 21X is different from that between the metal electrode 10X and the dielectric electrode 11X. However, the ground side electrode constituent part 2X is different from the high-voltage side electrode constituent part 1X in that a gas spray hole 25 (not shown in FIG. 30) is provided at the center of the dielectric electrode 21X.

Figure 31:
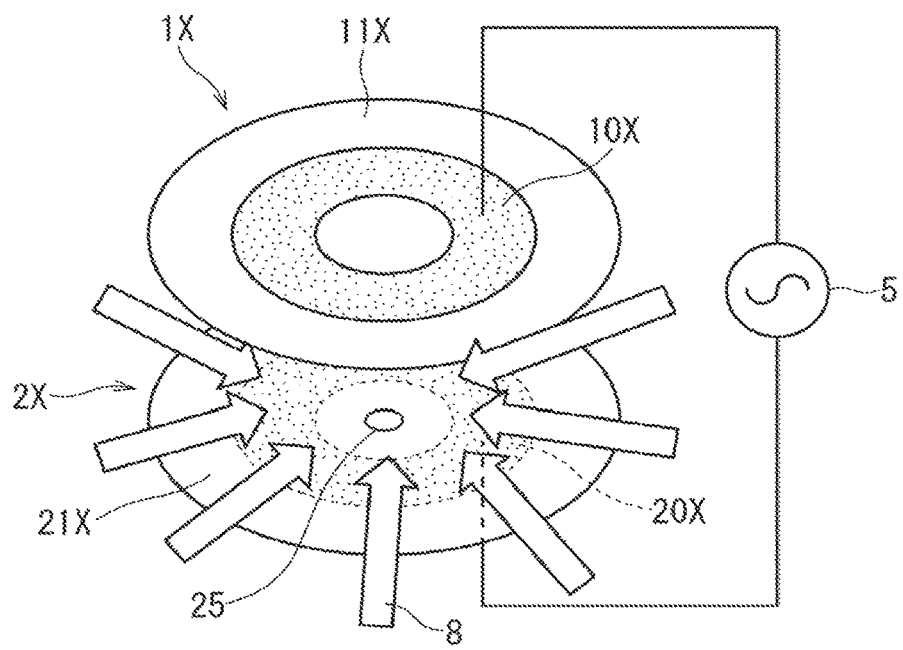
FIG. 31 is an illustration diagram schematically showing a basic configuration of an activated gas generating part of an activated gas generation apparatus achieved by the high-voltage side electrode constituent part and the ground side electrode constituent part shown in FIG. 30.

FIG. 31 is an illustration diagram schematically showing a basic configuration of a second activated gas generating part achieved by the high-voltage side electrode constituent part 1X and the ground side electrode constituent part 2X shown in FIG. 30.

Figure 14:
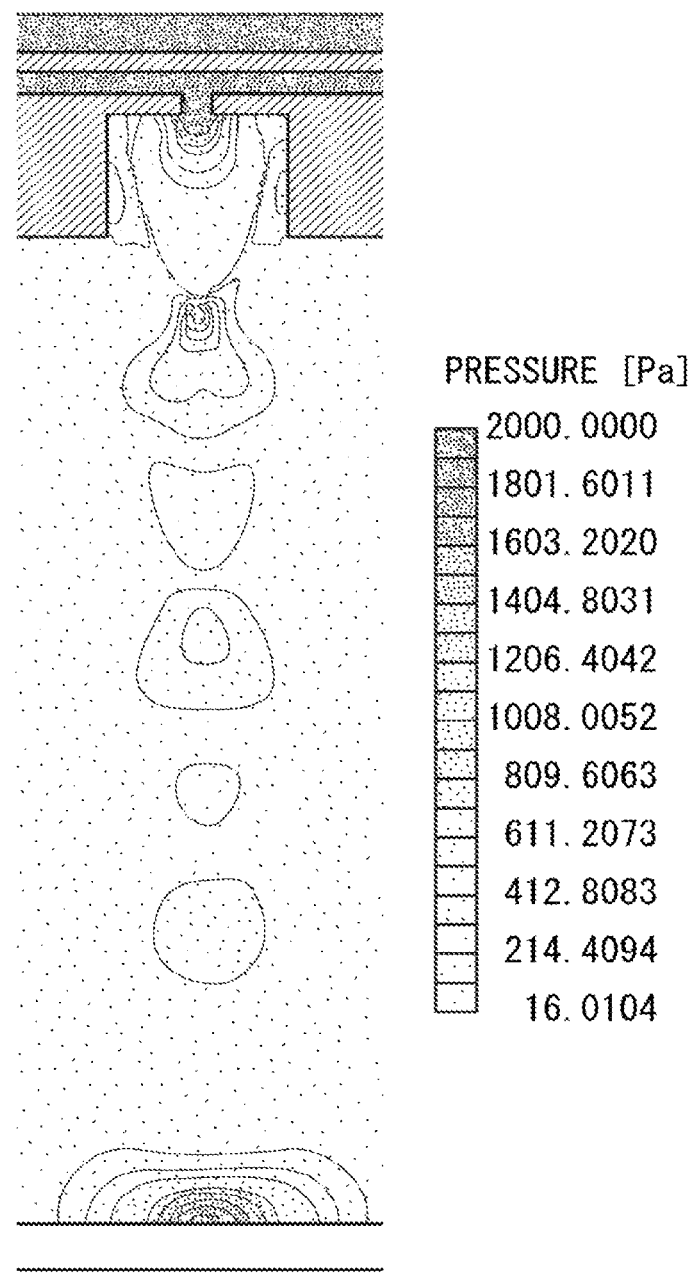
FIG. 14 is an illustration diagram schematically showing a pressure state of the gas jet using the nozzle constituent part according to the embodiment 1.

As shown in FIG. 14, the activated gas generation apparatus includes, as the basic configuration, the high-voltage side electrode constituent part 1X (first electrode constituent part), the ground side electrode constituent part 2X (second electrode constituent part) provided below the high-voltage side electrode constituent part 1X, and the high frequency power supply 5 (AC power supply part) for applying an AC voltage to the high-voltage side electrode constituent part 1X and the ground side electrode constituent part 2X.

The region where the metal electrodes 10X and 20X overlap with each other in plan view is defined as a discharge space (discharge field) in the dielectric space where the dielectric electrodes 11X and 21X face each other by the application of the AC voltage of the high frequency power supply 5. The above-described high-voltage side electrode constituent part 1X, ground side electrode constituent part 2X, and high frequency power supply 5 constitute the second activated gas generating part.

In such a configuration, the discharge space is formed between the high-voltage side electrode constituent part 1X and the ground side electrode constituent part 2X by the application of the AC voltage by the high frequency power supply 5, and a source gas is supplied along a gas flow 8 into the discharge space, to obtain the activated gas 7 such as radicalized nitrogen atoms, which allows the activated gas 7 to be sprayed to a lower outside from the gas spray hole 25 provided at the center of the dielectric electrode 21X.

Figure 32:
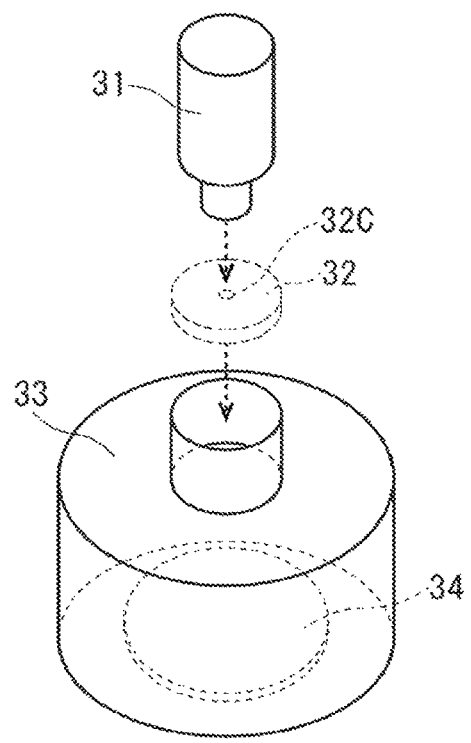
FIG. 32 is an illustration diagram schematically showing a configuration of a film-formation treatment apparatus including the activated gas generating part of FIG. 31 as a constituent element.

FIG. 32 is an illustration diagram schematically showing a configuration of a film-formation treatment apparatus including the above first or second activated gas generating part as a constituent element.

As shown in FIG. 32, a film formation treatment chamber 33 is disposed below an activated gas generation apparatus 31 in which the first or second activated gas generating part is stored in a housing, with an orifice forming part 32 sandwiched therebetween. For example, a wafer 34 having a diameter $\phi$ of 300 mm is disposed in the film formation treatment chamber 33.

In this case, the internal portion of the film formation treatment chamber 33 is set at a reduced pressure of about a few hundred Pa, while the internal portion of the activated gas generation apparatus 31 is kept in a high pressure state of about 10 kPa to about the atmospheric pressure in terms of the characteristics of the electrical discharge method. In order to provide a pressure difference therebetween, the gas spray hole 25 provided in the dielectric electrode 21X may have a size that functions as an orifice as in a center hole 32C of the orifice forming part 32.

Therefore, the film formation treatment chamber 33 is provided immediately below the activated gas generation apparatus 31 including the first or second activated gas generating part therein, and the gas spray hole 25 of the dielectric electrode 21X is caused to function as the center hole 32C of the orifice forming part 32, which makes it possible to achieve the film-formation treatment apparatus in which the film formation treatment chamber 33 is disposed immediately below the activated gas generation apparatus 31 without requiring the orifice forming part 32.

The activated gas generating electrode group 301 used in the embodiments 1 to 3 is obtained by improving the structures of the high-voltage side electrode constituent part 1 (1X) and ground side electrode constituent part 2 (2X) in the first or second activated gas generating part shown in FIGS. 29 to 31. The high-voltage side electrode constituent part 1A and the ground side electrode constituent part 2A correspond to the high-voltage side electrode constituent part 1 (1X) and the ground side electrode constituent part 2 (2X).

(Specific Configuration of Activated Gas Generating Electrode Group 301)

Figure 4:
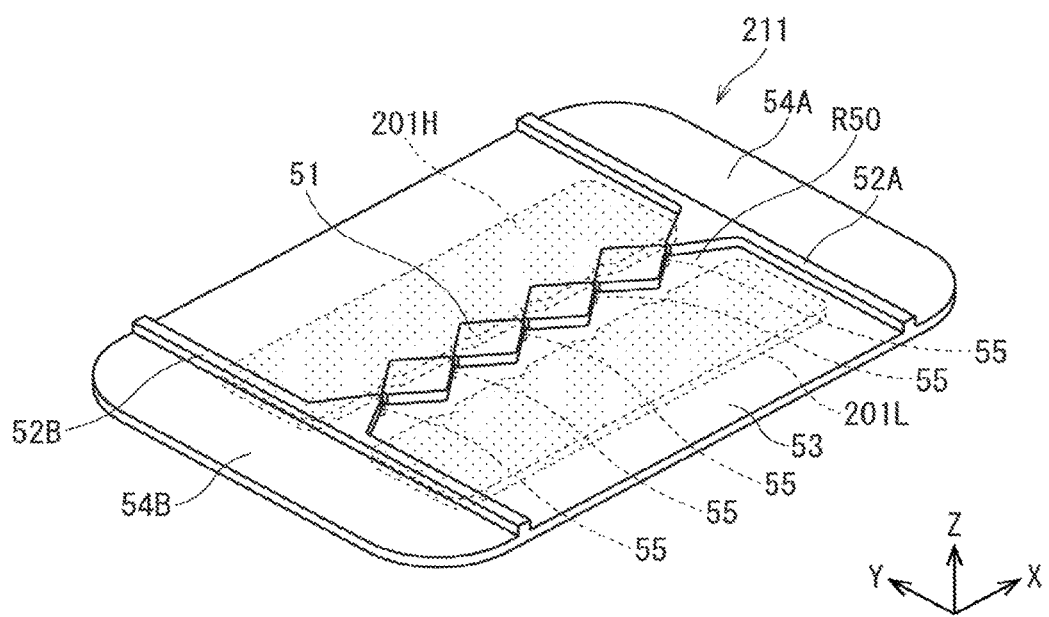
FIG. 4 is a perspective view showing an entire structure of a dielectric electrode of a ground side electrode constituent part constituting the activated gas generating electrode group.
Figure 5A:
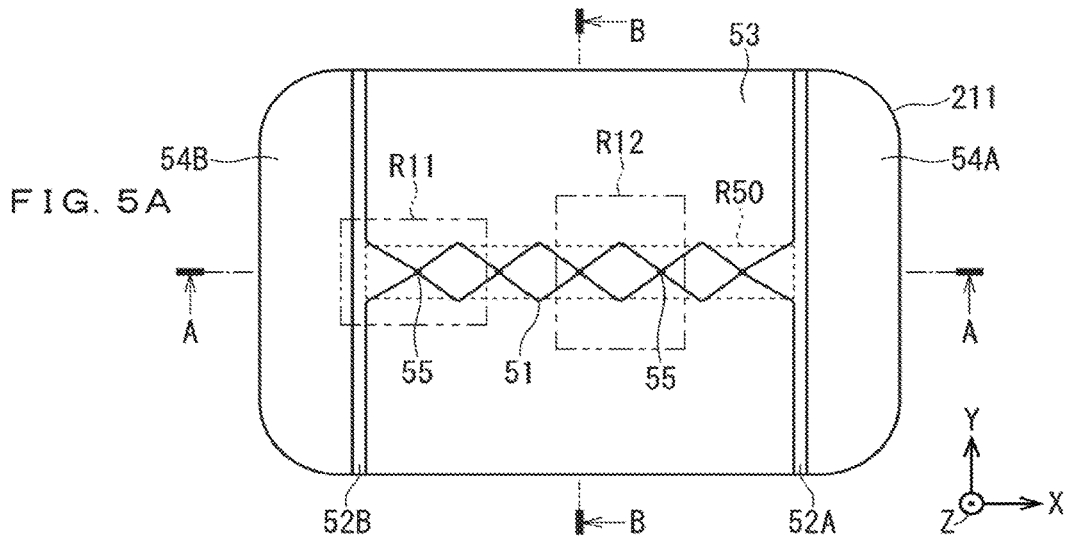
FIGS. 5A to 5D are illustration diagrams showing upper and bottom surface structures or the like of the ground side electrode constituent part.
Figure 5B:
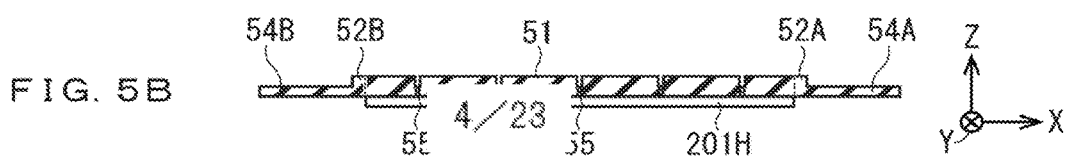
Figure 5C:
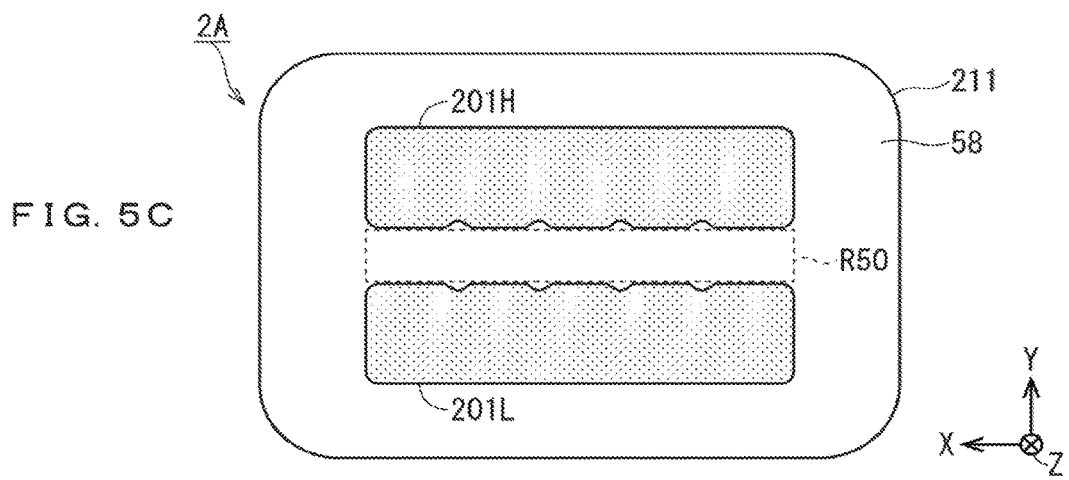
Figure 5D:
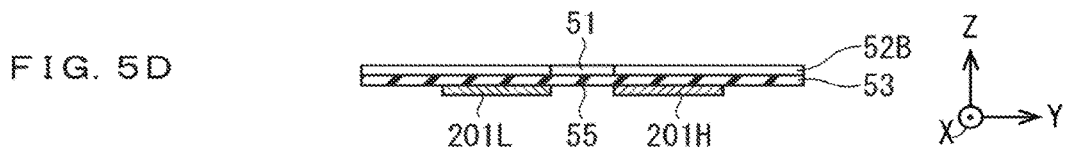

FIG. 4 is a perspective view showing an entire structure of a dielectric electrode 211 of a ground side electrode constituent part 2A constituting the activated gas generating electrode group 301. FIGS. 5A to 5D are illustration diagrams showing upper and bottom surface structures or the like of the ground side electrode constituent part 2A. FIG. 5A is a top view; FIG. 5B is a cross-sectional view taken along line A-A in FIG. 5A; FIG. 5C is a bottom view, and FIG. 5D is a cross-sectional view taken along line B-B in FIG. 5A.

Figure 6A:
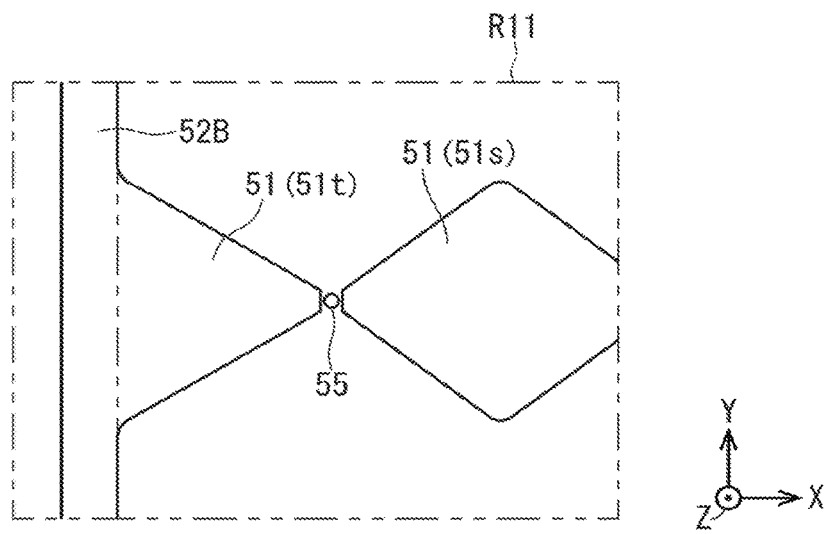
FIGS. 6A and 6B are enlarged illustration diagrams showing a focused region of FIGS. 5A to 5D.
Figure 6B:
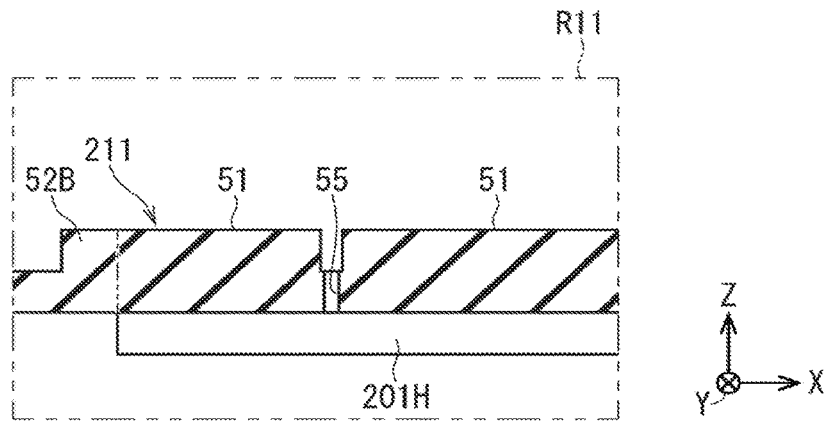
Figure 7:
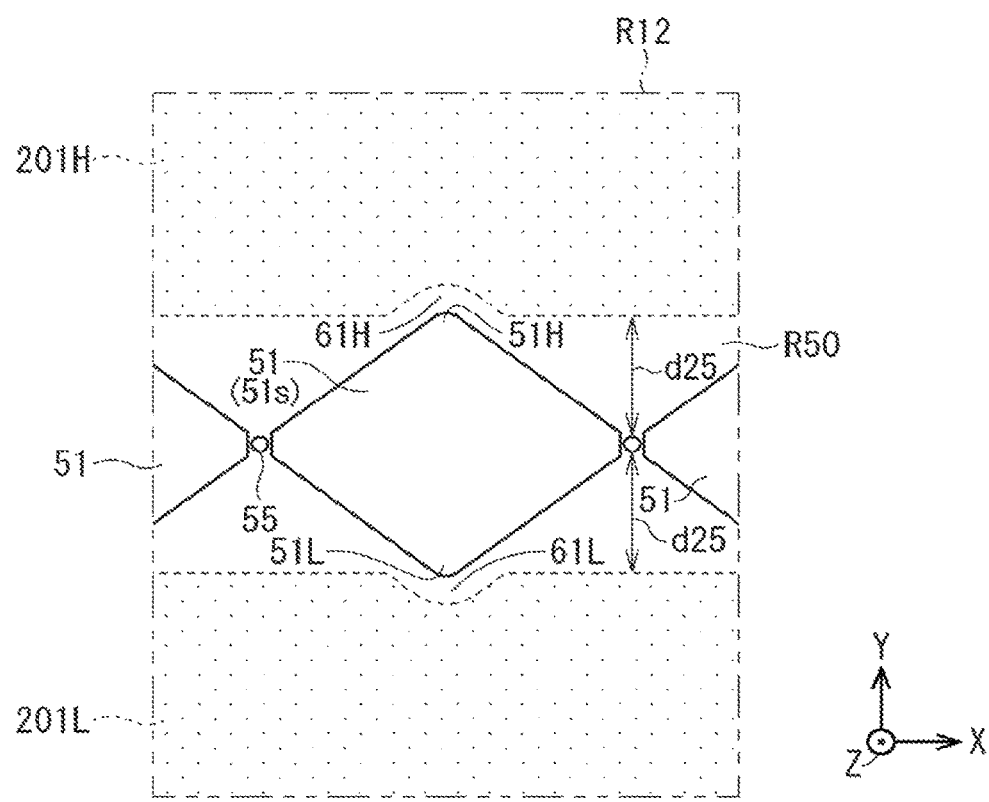
FIG. 7 is an enlarged top view showing a focused region of FIGS. 5A to 5D.

FIGS. 6A and 6B are enlarged illustration diagrams showing a focused region R11 of FIG. 5A. FIG. 6A is a top view; and FIG. 6B is a cross-sectional view taken along line A-A in the focused region R11. FIG. 7 is an enlarged top view of a focused region R12 of FIG. 5A. An XYZ coordinate system is appropriately shown in each of FIGS. 4 to 7.

As shown in FIGS. 4 to 7, the ground side electrode constituent part 2A (second electrode constituent part) of the activated gas generating electrode group 301 includes the dielectric electrode 211 and metal electrodes 201H, 201L (a pair of second partial metal electrodes; second metal electrode).

The dielectric electrode 211 has a rectangular flat plate structure with an X direction as a longitudinal direction and a Y direction as a short direction. Hereinafter, in the dielectric electrode 211, with linear stepped parts 52A, 52B described below as boundaries, a central part may be referred to as a main region 53, and both end parts may be referred to as end regions 54A, 54B.

With respect to the dielectric electrode 211 (second dielectric electrode), a plurality of (five) gas spray holes 55 are provided along the X direction (first direction) in a central region R50 in the main region 53. The plurality of gas spray holes 55 are provided so as to pass through the dielectric electrode 211 from the upper surface to the bottom surface. Each of the plurality of gas spray holes 55 has a circular shape with a diameter r1 which satisfies such a dimension that a sectional shape in plan view functions as an orifice.

As shown in FIGS. 5B and 5C, the metal electrodes 201H, 201L (a pair of second partial metal electrodes) are formed on the bottom surface of the dielectric electrode 211, and disposed so as to face each other with the central region R50 of the dielectric electrode 211 sandwiched therebetween in plan view. The metal electrodes 201H, 201L have a substantially rectangular shape in plan view, and have the X direction (first direction) as the longitudinal direction (electrode formation direction), and the Y direction (second direction) crossing at a right angle to the X direction, the Y directions of the metal electrodes 201H, 201L facing each other. The metal electrodes 201H, 201L are equal to each other in size in plan view, and are symmetrically disposed with the central region R50 as the center.

The metal electrodes 201H, 201L are formed by a metalization treatment on the bottom surface of the dielectric electrode 211. As a result, the dielectric electrode 211 and the metal electrodes 201H, 201L are integrally formed to constitute the ground side electrode constituent part 2A (second electrode constituent part). Examples of the metalization treatment include treatments using a printing firing method, a sputtering treatment, and a vapor deposition treatment or the like.

Figure 8A:
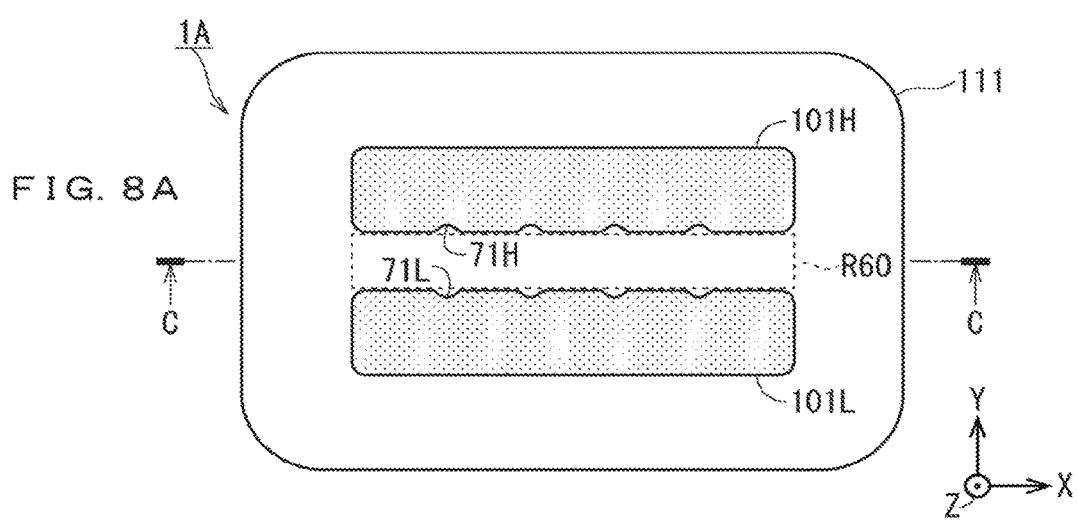
FIGS. 8A to 8C are illustration diagrams showing upper and bottom surface structures or the like of a high-voltage side electrode constituent part.
Figure 8B:
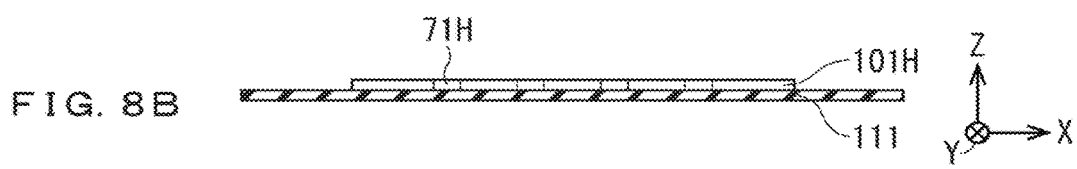
Figure 8C:
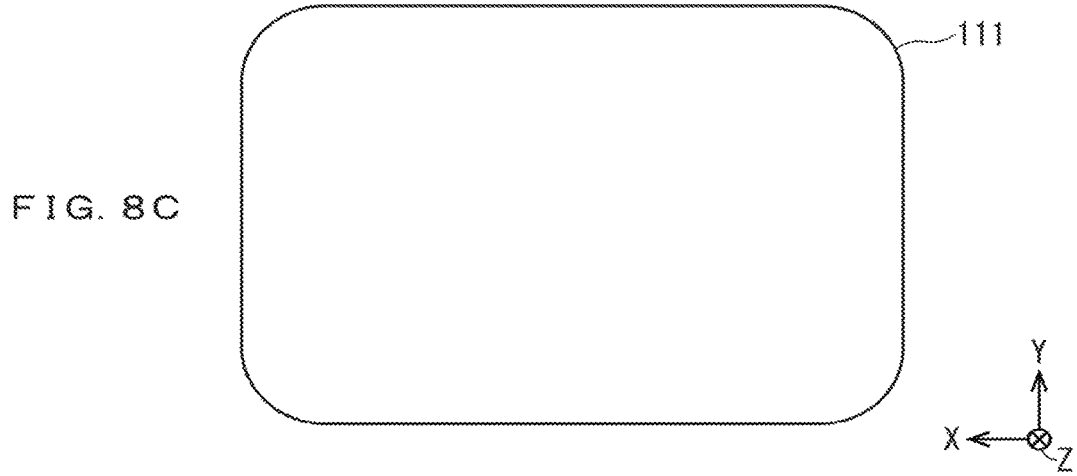

FIGS. 8A to 8C are illustration diagrams showing upper and bottom surface structures or the like of a high-voltage side electrode constituent part 1A (first electrode constituent part). FIG. 8A is a top view; FIG. 8B is a cross-sectional view taken along line C-C of FIG. 8A; and FIG. 8C is a bottom view. In FIGS. 8A to 8C, an XYZ coordinate system is appropriately shown.

As shown in FIGS. 5A to 5D, a dielectric electrode 111 has a rectangular flat plate structure with an X direction as a longitudinal direction and a Y direction as a short direction as with the dielectric electrode 211.

Metal electrodes 101H, 101L (a pair of first partial metal electrodes; first metal electrode) are formed on the upper surface of the dielectric electrode 111, and are disposed so as to face each other with a central region R60 sandwiched therebetween. The central region R60 has a shape equal to that of the central region R50 of the dielectric electrode 211 in plan view. In this case, as with the metal electrodes 201H, 201L, the metal electrodes 101H, 101L have a substantially rectangular shape in plan view, and have the X direction (first direction) as the longitudinal direction (electrode formation direction), and the Y direction (second direction) crossing at a right angle to the X direction, the Y directions of the metal electrodes 101H, 101L facing each other. The metal electrodes 101H, 101L are equal to each other in size in plan view, and are symmetrically disposed with the central region R60 as the center. However, the widths of the metal electrodes 101H, 101L in the short direction (Y direction) and in the longitudinal direction (X direction) are set to be slightly shorter than those of the metal electrodes 201H, 201L. The metal electrodes 101H, 101L can be formed on the upper surface of the dielectric electrode 111 by the metalization treatment as with the metal electrodes 201H, 201L.

Figure 9:
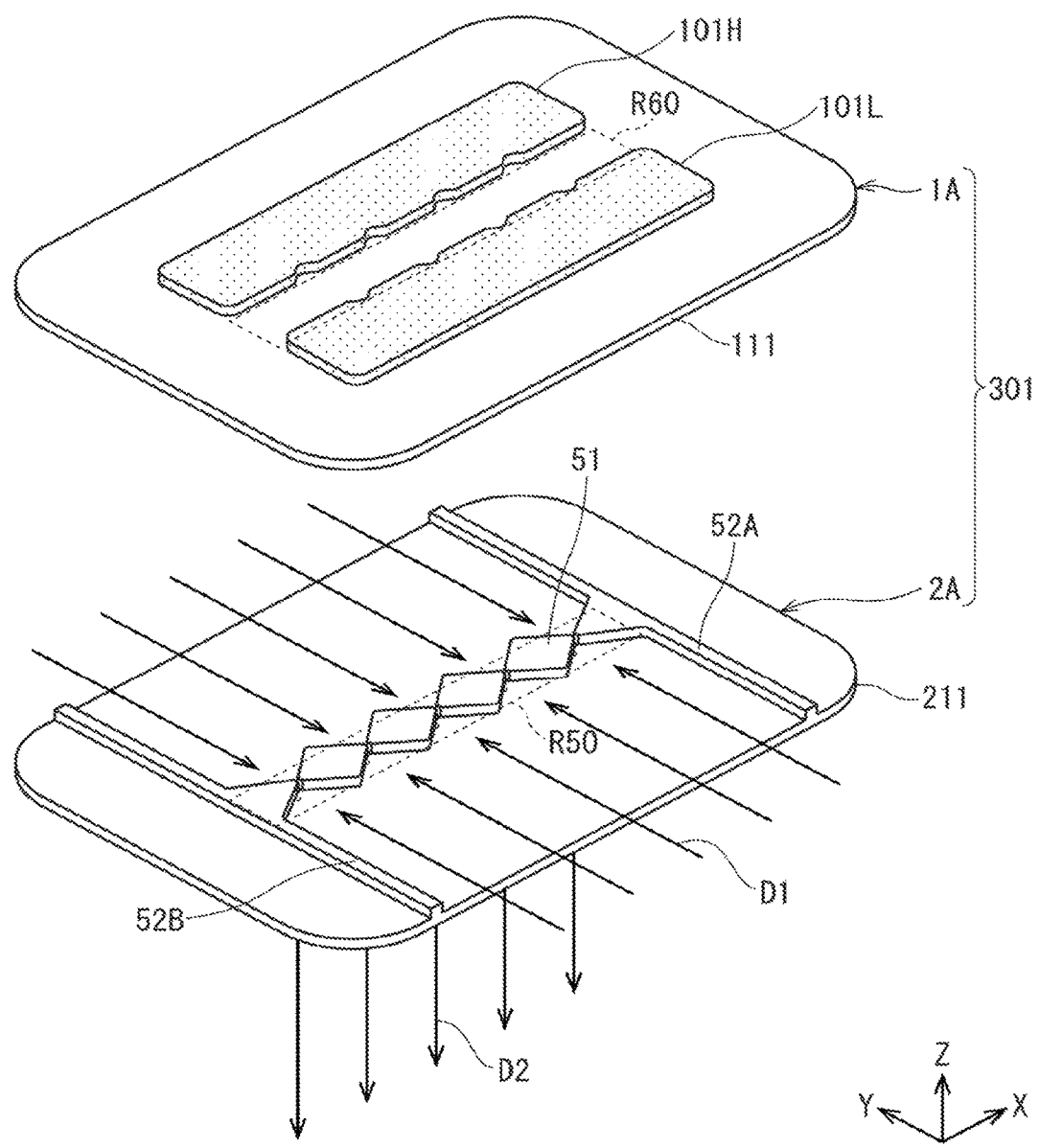
FIG. 9 is a perspective view (part 1) showing an assembling process of the high-voltage side electrode constituent part and the ground side electrode constituent part.
Figure 10:
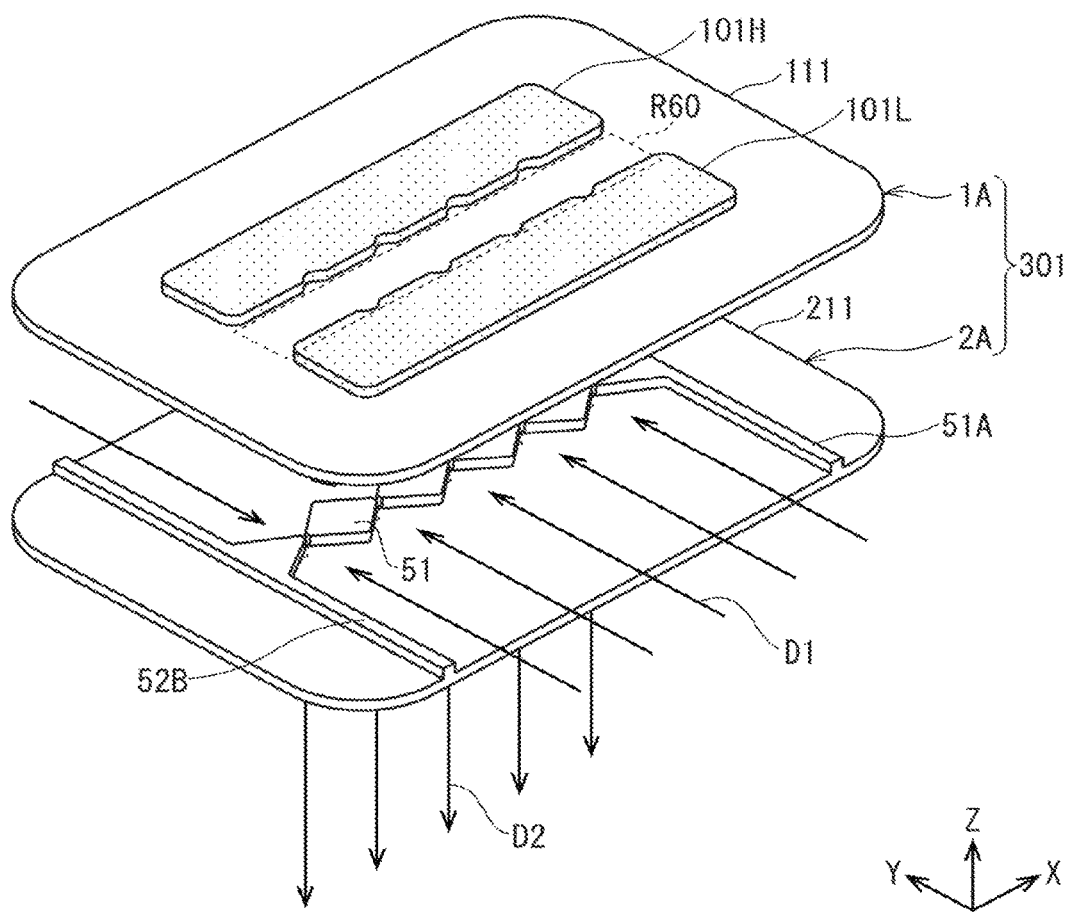
FIG. 10 is a perspective view (part 2) showing the assembling process of the high-voltage side electrode constituent part and the ground side electrode constituent part.
Figure 11:
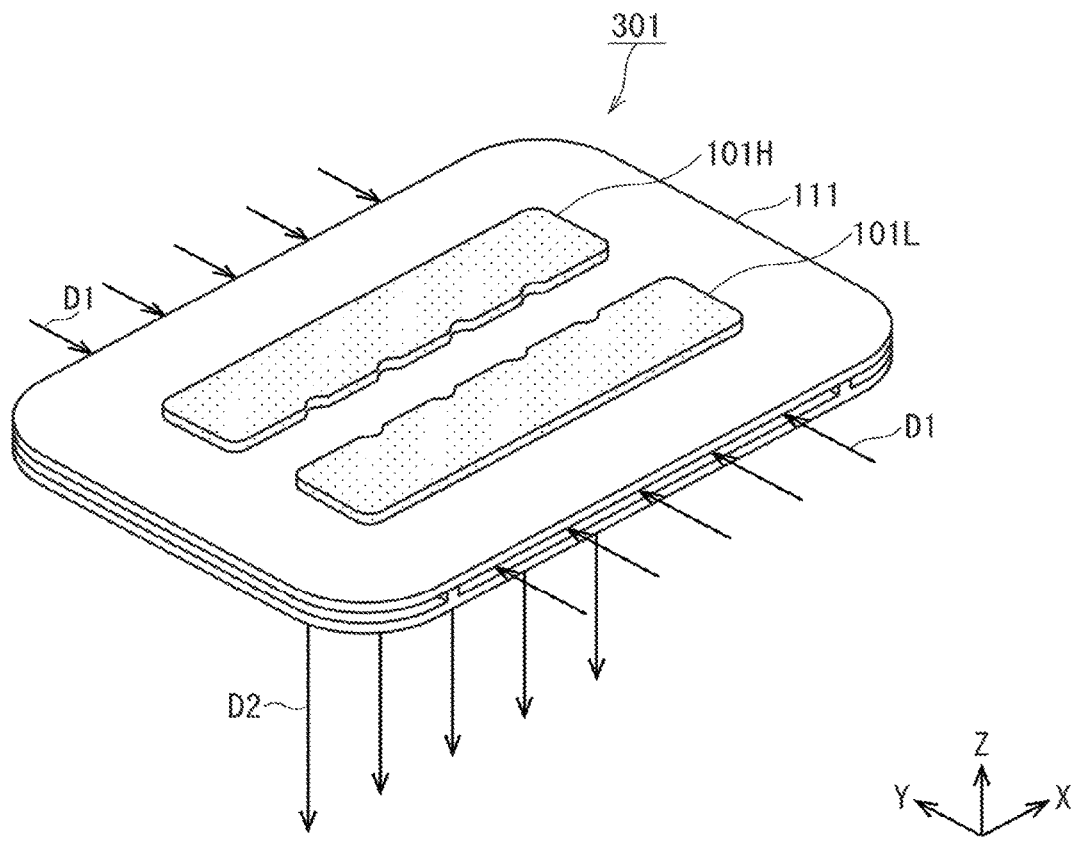
FIG. 11 is a perspective view (part 3) showing the assembling process of the high-voltage side electrode constituent part and the ground side electrode constituent part.

FIGS. 9 to 11 are perspective views showing an assembling process of the high-voltage side electrode constituent part 1A and the ground side electrode constituent part 2A. In FIGS. 9 to 11, an XYZ coordinate system is appropriately shown.

As shown in FIG. 9, an activated gas generating electrode group 301 can be assembled by disposing the high-voltage side electrode constituent part 1A on the ground side electrode constituent part 2A. As shown in FIGS. 9 and 10, while the central region R60 of the dielectric electrode 111 in the high-voltage side electrode constituent part 1A and the central region R50 of the dielectric electrode 211 in the ground side electrode constituent part 2A are positioned so as to overlap with each other in plan view, the high-voltage side electrode constituent part 1A is stacked on the ground side electrode constituent part 2A for assembling, so that the activated gas generating electrode group 301 can be finally completed as shown in FIG. 11.

In the dielectric space in which the dielectric electrode 111 and the dielectric electrode 211 constituting the activated gas generating electrode group 301 face each other, a region in which the metal electrodes 101H, 101L and the metal electrodes 201H, 201L overlap with each other in plan view is defined as a discharge space.

The metal electrodes 101H, 101L and the metal electrodes 201H, 201L which are metalization parts are connected to the (high voltage) high frequency power supply 5 as in the metal electrodes 10, 20 shown in FIG. 29. The metal electrodes 201H, 201L of the ground side electrode constituent part 2A are grounded. In the present embodiment, a 0 peak value is fixed at 2 to 10 kV from the high frequency power supply 5, and an AC voltage set at a frequency of 10 kHz to 100 kHz is applied between the metal electrodes 101H, 101L and the metal electrodes 201H, 201L.

As described above, unlike the dielectric electrode 211 of the ground side electrode constituent part 2A, the dielectric electrode 111 of the high-voltage side electrode constituent part 1A has upper and bottom surfaces each having a flat shape. Therefore, when the high-voltage side electrode constituent part 1A is combined with the ground side electrode constituent part 2A, the high-voltage side electrode constituent part 1A and the ground side electrode constituent part 2A are merely fixed from the upper side to the ground side electrode constituent part 2A side by a fastening force such as a spring or a bolt or the like. The high-voltage side electrode constituent part 1A and the ground side electrode constituent part 2A are not positioned by forming a counter boring shape or the like, which can provide the activated gas generating electrode group 301 which minimizes the possibility of occurrence of contamination due to the contact between the end faces of the dielectric electrode 111 and the dielectric electrode 211 during transportation or the like.

The discharge space (discharge field) described above cannot be brought close to the gas spray holes 55 by a certain interval or more in order to suppress abnormal discharge. Therefore, the space above the central region R50 (R60) from the discharge space to the gas spray holes 55 becomes a non-discharge space (non-discharge field, dead space). In the non-discharge space, an activated gas is merely decreased without being generated.

When the activated gas is generated in the discharge space, and passes through the discharge space, the activated gas is rapidly attenuated because of its high energy, and annihilates in a short time. In the case of the attenuation mechanism of activated gas that loses energy due to collision with other molecules in a ground state or the like, the rate of annihilation of the activated gas can be suppressed by simply lowering a pressure to merely lower a collision frequency. That is, it is important to promptly spray the activated gas generated in the discharge space near the atmospheric pressure to the treatment chamber housing 33X (see FIGS. 1 and 3) under reduced pressure. Therefore, the width in the Y direction of the central region R50 (R60) defining the non-discharge space described above is desirably made to be as narrow as possible.

The discharge space cannot be brought close to the gas spray holes 55 in order to minimize the non-discharge space. This is because abnormal discharge may occur when the activated gas is generated if the gas spray holes 55 are brought too close to the discharge space. Therefore, in order to fill the non-discharge space, the activated gas generating electrode group 301 of the embodiment 1 is characterized in that a wedge-shaped stepped part 51 (central region step part) projects upward in the central region R50 of the upper surface of the dielectric electrode 211, and is integrally formed as the constituent element of the dielectric electrode 211.

That is, the wedge-shaped stepped part 51 is formed so as to have a shorter formation width in the Y direction (second direction) as approaching each of the plurality of gas spray holes 55 in plan view without overlapping with the plurality of gas spray holes 55 in plan view. Specifically, the wedge-shaped stepped part 51 is formed by an aggregate of four rhombic shaped single body parts 51s (see FIG. 6A) which are formed in a rhombic shape in plan view between the five gas spray holes 55 and are discrete from each other, and two triangular single body parts 51t (see FIG. 6A) each having an approximately isosceles triangular shape in plan view provided outside the gas spray holes 55 on both ends among the five gas spray holes 55.

Therefore, the source gas is supplied from the outside toward above the central region R50 (below the central region R60) in the dielectric space along the Y direction (gas supply direction D1 shown in FIGS. 9 to 11), so that the activated gas obtained when the source gas passes through the discharge space can be generated, and sprayed from the plurality of gas spray holes 55 to the outside along a −Z direction (gas spray direction D2 shown in FIGS. 9 to 11).

In this case, the presence of the wedge-shaped stepped part 51 (central region step part) having four rhombic shaped single body parts 51s and two triangular single body parts 51t each discretely formed so as to have a shorter formation width in the Y direction as approaching each of the plurality of gas spray holes 55 allows a plurality of gas flow paths of the activated gas corresponding to the plurality of gas spray holes 55 to be narrowed down above the central region R50 (below the central region R60) in the dielectric space. As a result, the activated gas generating electrode group 301 can increase gas flow rate in each of the gas spray holes 55. As a result, a higher-density activated gas can be generated.

Needless to say, in addition to the planar shape such as that of the wedge-shaped stepped part 51, the planar shape may be, for example, a semicircular shape, and as long as the planar shape is a shape formed so as to have a shorter formation width in the Y direction (second direction) as approaching each of the gas spray holes 55 in plan view without overlapping with the plurality of gas spray holes 55 in plan view, the above effect can be achieved.

Examples of the source gas include a gas containing at least one of nitrogen, oxygen, fluorine, and hydrogen. That is, an aspect of supplying a gas such as oxygen, rare gases, hydrogen, or fluorines as the source gas is considered. These source gases advance from an outer peripheral part of the activated gas generating electrode group 301 to an inside along the gas supply direction D1, and become the activated gas via the discharge space. The activated gas (gas containing radicals) is sprayed from the plurality of gas spray holes 55 provided in the dielectric electrode 211 to the treatment chamber housing 33X (see FIG. 3) along the gas spray direction D2. By using the highly reactive activated gas in the treatment chamber housing 33X, the wafer 34 which is a substrate to be treated can be subjected to a film-formation treatment.

As described above, the activated gas generating electrode group 301 can generate a higher-density activated gas from the source gas containing at least one of nitrogen, oxygen, fluorine, and hydrogen.

The wedge-shaped stepped part 51 is provided on the upper surface of not the dielectric electrode 111 of the high-voltage side electrode constituent part 1A but the dielectric electrode 211 of the ground side electrode constituent part 2A. That is, the plurality of gas spray holes 55 and the wedge-shaped stepped part 51 are formed in the same dielectric electrode 211. As shown in FIGS. 9 to 11, this eliminates the need for positioning the plurality of gas spray holes 55 and the wedge-shaped stepped part 51 when the activated gas generating electrode group 301 is assembled, and can also achieve the simplification of the apparatus configuration.

The wedge-shaped stepped part 51 also functions as a spacer defining a gap length (a distance in a Z direction between the dielectric electrode 111 and the dielectric electrode 211) in the discharge space between the high-voltage side electrode constituent part 1A and the ground side electrode constituent part 2A.

Therefore, as shown in FIGS. 9 to 11, by a formation height of the wedge-shaped stepped part 51 according to a simple assembling process of laminating the high-voltage side electrode constituent part 1A on the ground side electrode constituent part 2A, the gap length in the discharge space can be set.

Conventionally, the spacer is often formed in the discharge space. In this case, creeping discharge going through the side face of the spacer occurs, which causes discharge loss and contamination occurrence. In the activated gas generating electrode group 301, the wedge-shaped stepped part 51 provided so as to protrude on the upper surface of the dielectric electrode 211 is provided in the central region R50 outside the discharge space, so that the wedge-shaped stepped part 51 leads to the suppression of the contamination occurrence or the like.

As shown in FIGS. 4 to 6, in a boundary region between the main region 53 and the end regions 54A, 54B present on both end sides, the dielectric electrode 211 further includes the linear stepped parts 52A, 52B (a pair of end region step parts) formed so as to protrude upward. The linear stepped parts 52A, 52B are formed so as to extend in the Y direction over the entire length in the short direction of the dielectric electrode 211 in plan view. The gap length in the discharge space is defined by the formation heights of the linear stepped parts 52A, 52B together with the formation height of the wedge-shaped stepped part 51.

The presence of the linear stepped parts 52A, 52B regulates the inflow of the gas into the discharge space from both the end parts in the X direction of the dielectric electrode 211. When the gas can flow in from both the end parts of the dielectric electrode 211, the gas spray holes 55 (the gas spray hole 55 present on the rightmost or leftmost side in FIG. 4) near both the end parts of the dielectric electrode 211 are apt to be influenced by the inflow amount of the activated gas, so that the calculation of the gas flow rate of the activated gas from each of the gas spray holes 55 is complicated, which causes a problem of difficult control. The problem is eliminated by providing the linear stepped parts 52A, 52B.

By providing the linear stepped parts 52A, 52B, a gas inflow path between the high-voltage side electrode constituent part 1A and the ground side electrode constituent part 2A is provided only from two surfaces in the Y direction. Therefore, the gas flow itself is relatively stabilized, so that a pressure distribution in the discharge space is constant, which can provide a uniform discharge space.

As described above, the dielectric electrode 211 further includes the linear stepped parts 52A, 52B, so that, even in the gas spray hole 55 close to both the end parts in the X direction among the plurality of gas spray holes 55, the influence of the inflow of an unintended gas or the like from both the end parts causes no phenomenon that the inflow amount of the activated gas changes. This makes it possible to spray the activated gas without causing variations among the plurality of gas spray holes 55. As a result, the pressure distribution is constant, and the flow rates of the plurality of gas spray holes 55 are equal to each other, which exhibits an effect of providing the generated radical density relatively equal to each other in the activated gas passing through the discharge space.

As shown in FIG. 7, a non-discharge distance d25 which is a distance in the Y direction between the discharge space (end parts on the central region R50 side of the metal electrodes 201H, 201L) and the plurality of gas spray holes 55 is set to 10 mm or more.

As described above, the non-discharge distance d25 is set to 10 mm or more, which makes it possible to hardly occur abnormal discharge when the activated gas is generated.

As shown in FIG. 7 which is an enlarged view of the focused region R12 of FIG. 5A, in order to minimize the non-discharge space, end parts 51H, 51L providing the longest formation length in the Y direction of the wedge-shaped stepped part 51 extend to positions adjacent to the metal electrodes 201H, 201L forming the discharge space. When the end parts 51H, 51L of the wedge-shaped stepped part 51 and the metal electrodes 201H, 201L overlap with each other, abnormal discharge may be induced when the activated gas is generated, so that cutout parts 61H, 61L having a substantially triangular shape in plan view are provided in regions corresponding to the end parts 51H, 51L in the metal electrodes 201H, 201L defining the discharge space. As a result, a distance equal to or greater than a predetermined reference distance (for example, 2 to 3 mm) is secured between the wedge-shaped stepped part 51 and the metal electrodes 201H, 201L.

Similarly, as shown in FIGS. 8A, 8B, the metal electrodes 101H, 101L also have cutout parts 71H and 71L at positions corresponding to the end parts 51H, 51L.

As described above, the planar shapes of the metal electrodes 101H, 101L and the metal electrodes 201H, 201L are set so that a shortest distance in plan view between the discharge space defined by the overlapping area in plan view of the metal electrodes 101H, 101L and the metal electrodes 201H, 201L, and the wedge-shaped stepped part 51 is equal to or greater than a predetermined reference distance, which makes it possible to prevent abnormal discharge from occurring when the activated gas is generated.

As described above, the widths of the metal electrodes 101H, 101L in the short direction (Y direction) and the longitudinal direction (X direction) are set to be slightly shorter than those of the metal electrodes 201H, 201L, so that planar shapes of the metal electrodes 101H, 101L and the metal electrodes 201H, 201L are partially different from each other.

As a result, the occurrence of abnormal discharge which is apt to occur on the end faces of the metal electrodes 101H, 101L or the metal electrodes 201H, 201L can be suppressed.

When the above effect is not emphasized, the planar shapes of the metal electrodes 101H, 101L and the metal electrodes 201H, 201L may be perfectly matched to each other.

Furthermore, among the high-voltage side electrode constituent part 1A and the ground side electrode constituent part 2A (in particular, the dielectric electrodes 111, 211), a gas contacting region which is a region brought into contact with the activated gas is desirably formed of quartz, alumina, silicon nitride, or aluminum nitride as a constituent material.

The surface formed of the constituent material is a chemically stable substance against the activated gas, so that the activated gas can be sprayed from the gas spray holes in a state where the deactivation of the activated gas is suppressed between the surface and the gas contacting region brought into contact with the activated gas.

As the basic configuration, the plurality of gas spray holes 55 are formed so as to have the same shape (circular shape having the same diameter r1).

On the other hand, a modified configuration is also considered, in which the shapes (diameters) of the plurality of gas spray holes are set to be different from each other between the plurality of gas spray holes 55. However, the plurality of gas spray holes 55 are required to satisfy dimensional conditions constituting the orifice.

When the modified configuration is adopted in the activated gas generation apparatus 501 of the embodiment 1, the activated gas generation apparatus can exhibit an effect of setting the spray amount to different contents between the plurality of gas spray holes 55.

(Application to Film-Formation Treatment Apparatus)

As shown in FIG. 3, the activated gas generating electrode group 301 constituted by combining the high-voltage side electrode constituent part 1A with the ground side electrode constituent part 2A is stored in the generator housing 31X of the activated gas generation apparatus.

There will be considered a case where the film-formation treatment apparatus is configured using the activated gas generation apparatus 501 of the embodiment 1.

In this case, the activated gas (radical-containing gas) can pass through the inactive space above the central region R50 in the activated gas generating electrode group 301 in a shorter time, so that a high-density activated gas can be supplied into the treatment chamber housing 33X via the nozzle constituent part 40 and the gas jet flow straightener 70. As a result, a decrease in a film formation temperature when the film is formed on the wafer 34 disposed on the bottom surface of the treatment chamber housing 33X, and a reduction in a treatment time can be achieved.

There will be considered a specific configuration of a case where the plurality of gas spray holes 55 formed in the dielectric electrode 211 of the ground side electrode constituent part 2A have the orifice function. In this case, for example, as one example, the following environmental setting will be considered: "gas flow rate of source gas: 4 slm; pressure on upstream side of orifice (in generator housing 31X): 30 kPa, pressure on downstream side of orifice (in treatment chamber housing 33X): 266 Pa, diameter of gas spray hole 55 (orifice): ϕ1.3 mm; and formation length of gas spray hole 55 (length in Z direction, orifice length): 1 mm".

The film-formation treatment apparatus subjected to the environment setting can directly apply the activated gas to the wafer 34 in the treatment chamber housing 33X provided immediately below via the nozzle constituent part 40 and the gas jet flow straightener 70, so that an activated gas having a higher density and a higher electric field can be applied to the surface of the wafer 34, and a higher-quality film formation treatment can be achieved, which provides an effect of easily providing film formation having a high aspect ratio and three dimensional film formation.

It is desirable that the pressure of the discharge space in the activated gas generating electrode group 301 be set to be from 10 kPa to the atmospheric pressure, and the pressure inside the treatment chamber housing 33X be set to be equal to or lower than the pressure of the discharge space.

The activated gas generating electrode group 301 having the above constitution can move the activated gas into the treatment chamber housing 33X having a low pressure field according to the pressure setting, so that an effect of suppressing the attenuation amount of the density of the activated gas can be exhibited.

(Problem of Activated Gas Generating Electrode Group 301)

Each of the plurality of gas spray holes 55 in the activated gas generating electrode group 301 has a circular cross-sectional shape (round hole) in plan view, and the gas spray holes 55 are linearly disposed.

The object is to uniformly perform a film forming treatment such as a nitriding treatment in the range where the plurality of gas spray holes 55 are disposed. The uniformity largely depends on a hole pitch which is a distance between the plurality of gas spray holes 55. From the result of the film formation treatment, it is necessary to set the hole pitch to about several millimeters and the number of holes to several tens or more.

However, each of the plurality of gas spray holes 55 also functions as an orifice forming a pressure difference between the discharge field formed upstream of the gas spray holes 55 and the treatment chamber housing 33X downstream thereof, so that the total hole area of the plurality of gas spray holes 55 is predetermined, and cannot be changed. When several tens of gas spray holes 55 are provided, the hole diameter of each of the gas spray holes 55 is small, and falls below the minimum processing limit to ceramic which is the constituent material of the dielectric electrode 211.

Therefore, when the plurality of gas spray holes 55 are provided with the hole size and the hole number according to the minimum processing hole diameter, the hole pitch inevitably becomes large. The activated gas generating electrode group 301 has a problem that it is not suitable for a uniform treatment of uniformly injecting the activated gas generated by the discharge phenomenon to the wafer 34.

For example, when the total hole area of the plurality of gas spray holes 55 is limited to 10 mm$^2$, ten gas spray holes 55 having a hole diameter of 1.13 mm per unit are formed at present, and the hole pitch between the gas spray holes 55, 55 is set to 30 mm. The flow rate of the activated gas 7 is assumed to be 30 L/min. Therefore, in order to uniformly inject the activated gas 7, assuming ideal processing in which the hole pitch is set to 3 mm and the number of holes is set to 91 with respect to the gas spray hole 55 to set a hole arrangement density to 10 times of the current value, it is necessary to set the hole diameter per one unit of the gas spray holes 55 to 0.37 mm. However, the thickness of the dielectric electrode 211 is about 1 mm, so that the minimum processing hole diameter is at most ϕ0.4 mm. Considering that the hole diameter tolerance is required to be set to 10% or less of the hole dimension (tolerance: ±0.03 to 0.04 mm), the current processing technique makes it extremely difficult to satisfy the hole diameter tolerance to achieve the ideal processing.

A first improvement method is conceivable, in which the shape of the gas spray hole 55 is not a hole shape but a slit shape, and the activated gas is continuously supplied to the wafer 34, so that the occurrence of nitriding unevenness or the like caused by uneven activated gas injection is suppressed. In this case, it is necessary to set a slit opening area equal to a predetermined orifice area. This provides a minimal slit having a slit width of about several tens of micrometers, which makes it impossible to form the minimal slit in ceramic while maintaining a certain amount of tolerance over a distance of several hundreds of millimeters.

For example, when the above-described total hole area is limited to 10 mm$^2$, and the longitudinal lengths of the slit gas spray holes replacing the plurality of gas spray holes 55 are set to 300 mm, it is necessary to set the slit width in the short direction to 30 to 40 μm. It is substantially impossible to process the dielectric electrode 211 having a thickness of about 1 mm at the slit width with the hole diameter tolerance satisfactorily set to 10% or less of the hole dimension. Therefore, it is substantially impossible to adopt the first improvement method.

A second improvement method is conceivable, in which the pressure difference is not wholly provided by a single stage orifice but the pressure difference per one stage is reduced by providing a plurality pressure differences to constitute the orifice in a plurality of stages. As the pressure difference is smaller, the orifice area can be set to be larger. Therefore, the gas spray hole can have a size capable of being processed regardless of whether the shape of the gas spray hole is a hole-like shape or a slit-like shape. In this case, however, as the pressure difference during passing through the orifice is smaller, the deactivation of the radicals contained in the activated gas progresses. The amount of N atom radicals is halved at several milliseconds to several tens of milliseconds under pressure of several tens of kilopascals, so that most radicals are expected to be deactivated when a plurality of stages of orifices are provided. Therefore, it is substantially impossible to adopt the second improvement method.

When each of the plurality of gas spray holes 55 provided in the activated gas generating electrode group 301 has an orifice function, and injects the activated gas at an ultrahigh speed exceeding Mach, the gas speed, the gas impact pressure of the Mach speed, and the temperature state influence a gas flow rate frame (gas jet speed), and provide an effect of extremely decreasing the gas flow rate at a certain injecting position. As a result, a phenomenon occurs, which causes a Mach disk state (state where the gas flow rate is extremely lowered at a certain injecting position). It is desirable to minimize the phenomenon causing the Mach disk state, but no specific solution has been found.

In order to solve the problem of the activated gas generating electrode group 301, in the activated gas generation apparatus 501 of the embodiment 1, the nozzle constituent part 40 as a countermeasure against Mach disk, and the gas jet flow straightener 70 as a countermeasure against uniform injection of the activated gas are provided downstream of the activated gas generating electrode group 301.

(Nozzle Constituent Part 40)

FIG. 12 is an illustration diagram showing cross-sectional structures of the nozzle part 12 and its surroundings in the nozzle constituent part 40 used in the activated gas generation apparatus 501 according to the embodiment of the present invention. In FIG. 12, an XYZ rectangular coordinate system is shown.

As shown in FIG. 12, the nozzle part 12 includes the second stage restricting cylinder 14 (second restricting cylinder) as the main constituent part. The gas spray hole 55 formed in the upper ground side electrode constituent part 2A has an activated gas injection combined structure C40 provided by the first stage restricting cylinder 13 (first restricting cylinder) and the second stage restricting cylinder 14 of the nozzle part 12. Hereinafter, the gas spray hole 55 will be described as the first stage restricting cylinder 13.

As described above, the first stage restricting cylinder 13 (gas spray hole 55) constituting the activated gas injection combined structure C40 has a circular opening cross-sectional shape with a diameter r1 (first diameter) in an XY plane (in plan view), and supplies the activated gas 7 generated from the activated gas generating electrode group 301 downward (−Z direction). The diameter r1 is set so that the pressure difference between the inside of the generator housing 31X (the inside of the space in the stage before passing through the gas spray hole 55 of the activated gas generating electrode group 301) and the inside of the treatment chamber housing 33X is equal to or higher than a predetermined pressure ratio.

The second stage restricting cylinder 14 of the nozzle part 12 is continuously disposed with the first stage restricting cylinder 13 along the Z direction, and has a bottom surface having an circular opening cross-sectional shape with a diameter r2 (second diameter) (in plan view) in the XY plane. The activated gas 7 supplied from the first stage restricting cylinder 13 is supplied toward the gas flow-straightening passage 71 of the lower gas jet flow straightener 70. The diameter r2 is set so as to satisfy "r2>r1".

For example, the diameter r1 of the first stage restricting cylinder 13 (gas spray hole 55) is 1.35 mm, and the depth (formation length extending in the Z direction) is 1 mm. The diameter r2 of the second stage restricting cylinder 14 is 8 mm, and the depth (formation length extending in the Z direction) is 4 mm. For example, nitrogen gas as the activated gas 7 is supplied at a flow rate of 4 slm (standard liter per minute). Therefore, the activated gas 7 which has passed through the first stage restricting cylinder 13 becomes an ultra-high-speed gas, and is supplied into the treatment chamber housing 33X via the second stage restricting cylinder 14 and the gas jet flow straightener 70.

The space in the generator housing 31X (in the stage before passing through the plurality of gas spray holes 55 of the activated gas generating electrode group 301) becomes the primary pressure space, and the pressure inside the primary pressure space becomes the primary pressure.

The secondary pressure is determined by the first stage restricting cylinder 13 which is the gas spray hole 55. The activated gas 7 is supplied into the gas flow-straightening passage 71 of the gas jet flow straightener 70 via the second stage restricting cylinder 14.

At that time, the pressure ratio PC between the primary pressure inside the primary pressure space and the secondary pressure inside the treatment chamber housing 33X is set to be 30 times or more. Then, the flow rate of the activated gas 7 which has passed through the first stage restricting cylinder 13 reaches a flow rate equal to or higher than Mach by the above pressure ratio PC. Due to the presence of the second stage restricting cylinder 14, the activated gas 7 suppresses the phenomenon in which the Mach disk state generated by high speed jets occurs, and is then supplied into the gas jet flow straightener 70.

For example, if the primary pressure inside the primary pressure space is 30 kPa, and the pressure inside the treatment chamber housing 33X is 266 Pa, the activated gas 7 has the maximum Mach number exceeding "5" as an ultrahigh-speed gas, and supplied to the wafer 34 stored in the treatment chamber housing 33X via the gas jet flow straightener 70.

In this case, the Mach disk state of which the occurrence is concerned is effectively suppressed by the presence of the second stage restricting cylinder 14 of the nozzle part 12, so that the gas can be applied to the wafer in a higher speed state than that in the conventional technique.

That is, while, by providing the nozzle part 12 having the second stage restricting cylinder 14, the pressure distribution and the flow rate distribution in the treatment chamber housing 33X are eased, to avoid the occurrence of the Mach disc MD state, the activated gas 7 is supplied into the treatment chamber housing 33X, and supplied to the wafer 34 placed on the bottom surface of the treatment chamber housing 33X.

(Comparison with General Configuration or the Like)

Figure 13:
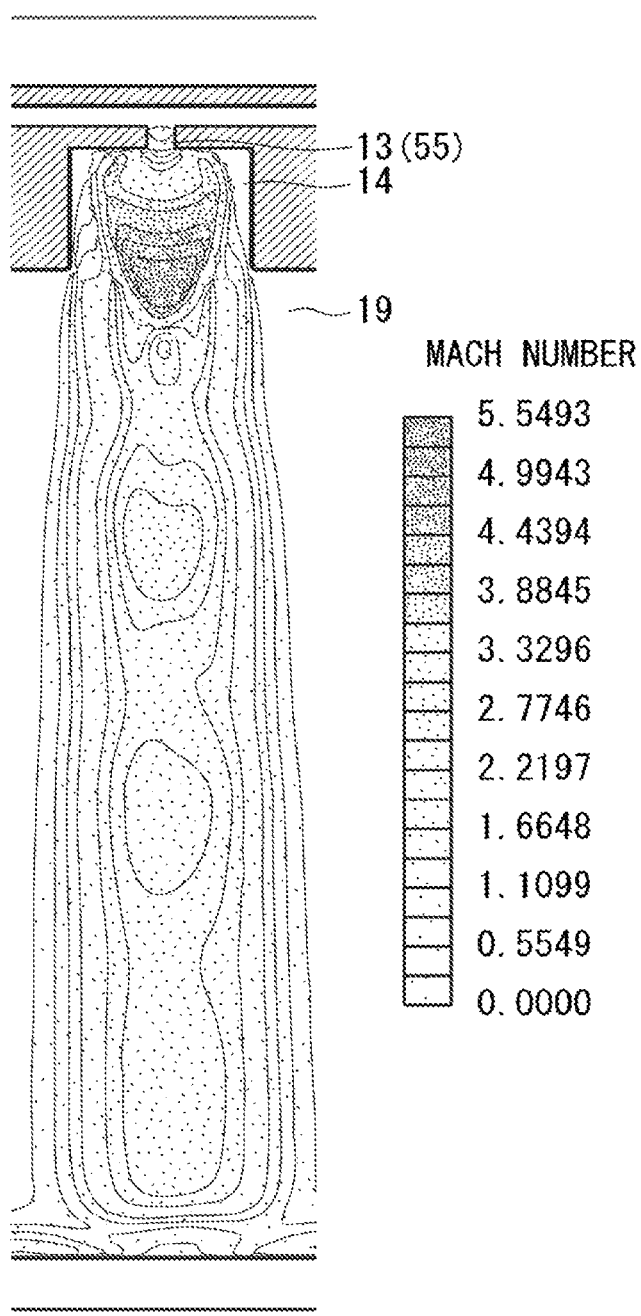
FIG. 13 is an illustration diagram schematically showing a speed condition of a gas jet using the nozzle constituent part according to the embodiment 1.

FIG. 13 is an illustration diagram schematically illustrating a speed condition of a gas jet using the nozzle constituent part 40 having the nozzle part 12.

FIG. 14 is an illustration diagram schematically showing a pressure state of the gas jet using the nozzle constituent part 40 having the nozzle part 12.

FIG. 15 is an illustration diagram schematically showing a speed condition of a gas jet in a general configuration composed only of the first stage restricting cylinder 13, that is, having no nozzle constituent part 40.

Figure 16:
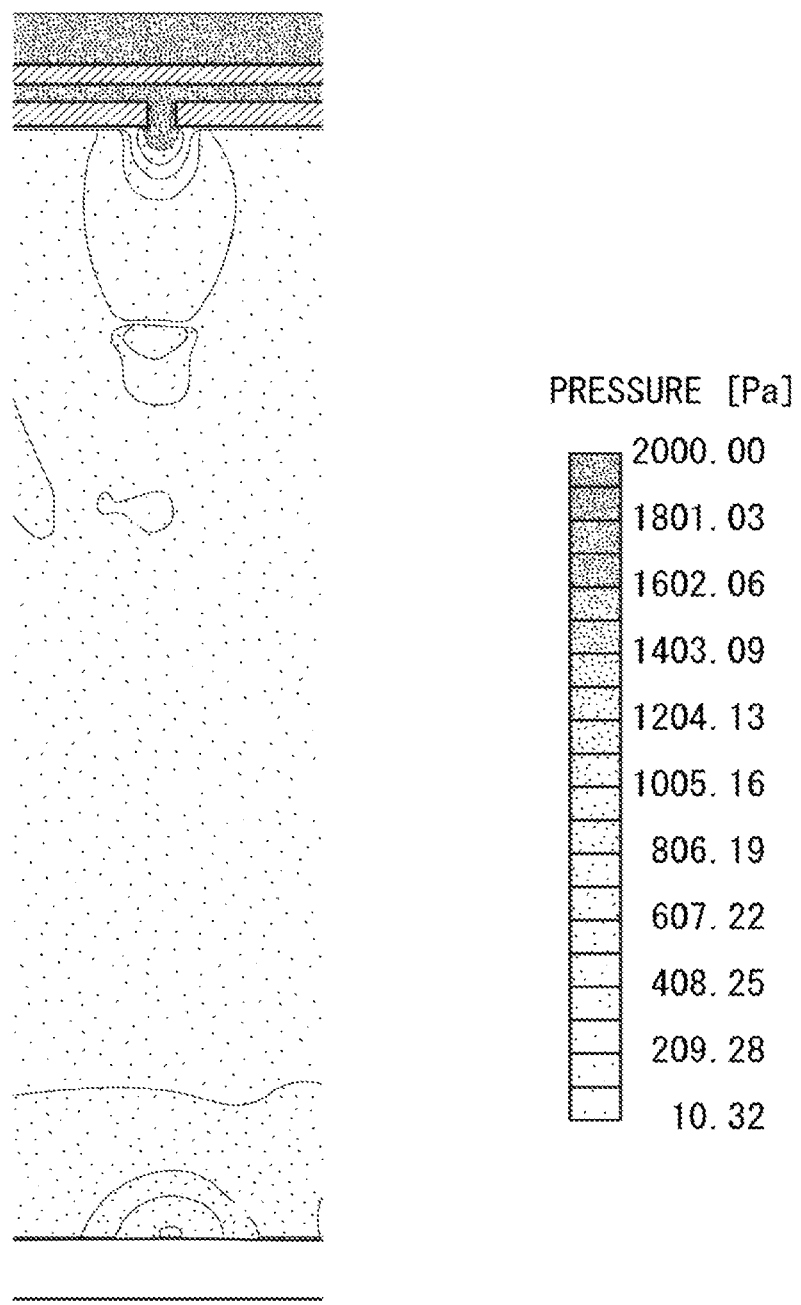
FIG. 16 is an illustration diagram schematically showing a pressure state of the gas jet in the conventional configuration.

FIG. 16 is an illustration diagram schematically showing a pressure state of a gas jet in a general configuration composed only of the first stage restricting cylinder 13. In FIGS. 13 to 16, the uppermost hatched part corresponds to the formation region of the high-voltage side electrode constituent part 1A in the activated gas generating electrode group 301.

As shown in FIGS. 14 and 16, the above-described pressure ratio PC between the primary pressure and the secondary pressure is set to 30 times or more.

As is apparent from the comparison between FIG. 13 and FIG. 15, the nozzle constituent part 40 having the nozzle part 12 avoids the phenomenon in which a Mach disk MD occurs, to allow the activated gas 7 to be supplied to the wafer 34 without extremely lowering the speed. In contrast, as shown in FIG. 15, a Mach disk MD is generated in the conventional gas supply apparatus.

Figure 17:
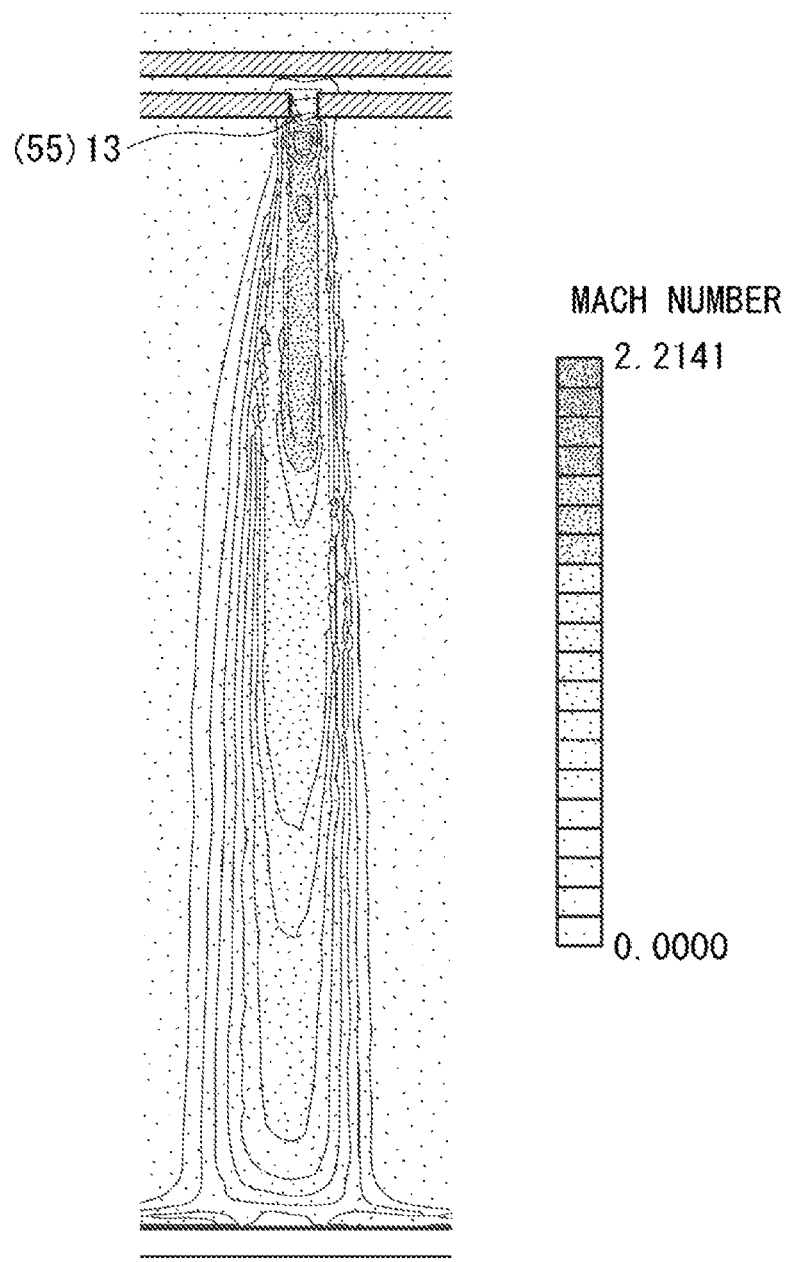
FIG. 17 is an illustration diagram schematically showing a speed condition of a gas jet when a pressure ratio between a generator housing and a treatment chamber housing is less than 30 times.

FIG. 17 is an illustration diagram schematically illustrating a speed condition of a gas jet when the pressure ratio PC between the generator housing 31X (primary pressure space therein) and the treatment chamber housing 33X is less than 30 times in the configuration of the nozzle constituent part 40.

Figure 18:
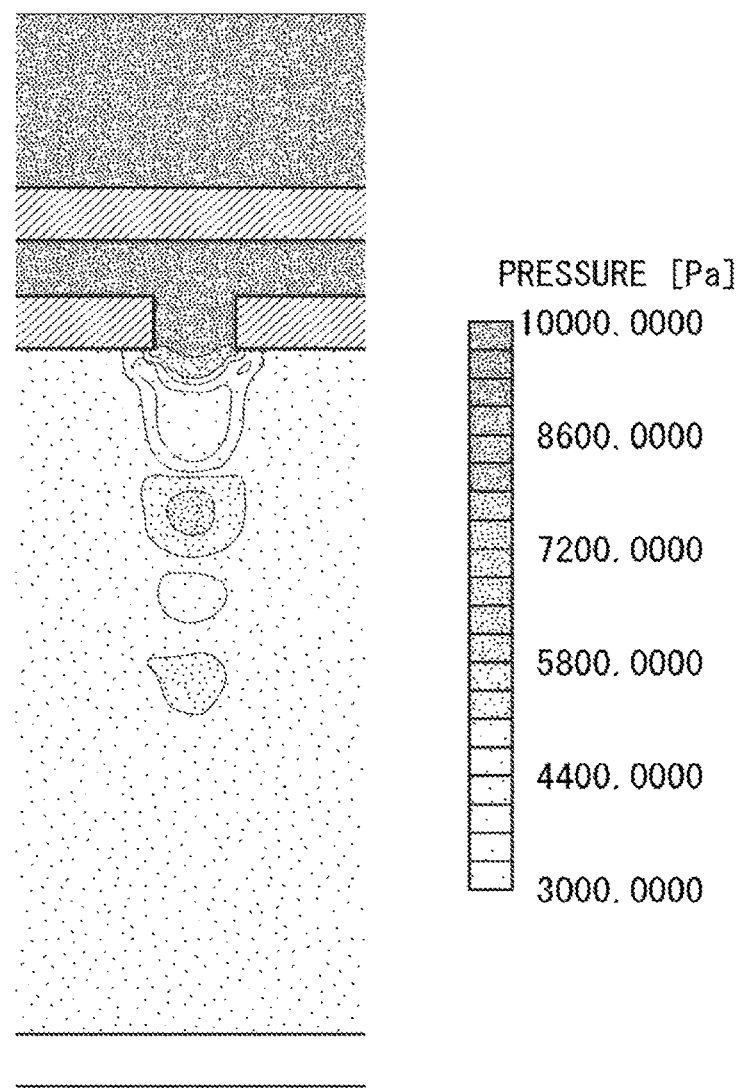
FIG. 18 is an illustration diagram schematically showing a pressure state of a gas jet when the pressure ratio between the generator housing and the treatment chamber housing is less than 30 times.

FIG. 18 is an illustration diagram schematically illustrating a pressure state of the gas jet when the pressure ratio PC between the generator housing 31X and the treatment chamber housing 33X is less than 30 times in the configuration of the embodiment 1. In FIGS. 17 and 18, the uppermost hatched part corresponds to the formation region of the high-voltage side electrode constituent part 1A in the activated gas generating electrode group 301 to be described later.

As shown in FIG. 18, the above-described pressure ratio PC between the primary pressure and the secondary pressure is set to less than 30 times.

As is apparent from the comparison between FIG. 13 and FIG. 17, in a case where the pressure ratio PC is 30 times or more, a speed distribution with a higher jet speed is obtained as compared with a case where the pressure ratio PC is less than 30 times. A gas having directivity can be reliably supplied to the surface of the wafer 34.

(Effects Provided by Second Stage Restricting Cylinder 14)

Figure 19:
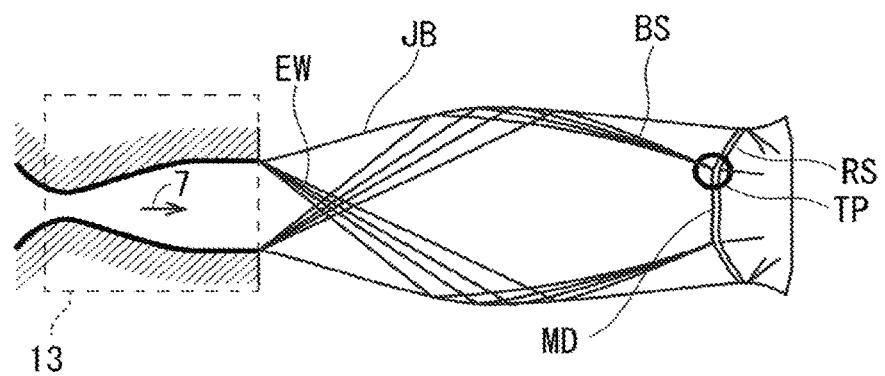
FIG. 19 is an illustration diagram schematically showing a Mach disk generation structure in the conventional configuration.

FIG. 19 is an illustration diagram schematically showing a Mach disk generation structure in the case of the general configuration including only the first stage restricting cylinder 13. FIG. 19 assumes a configuration in which the nozzle constituent part 40 and the gas jet flow straightener 70 are omitted in the overall configuration shown in FIGS. 1 to 3.

When the activated gas 7 which is the supply gas passes through the first stage restricting cylinder 13 (orifice), the primary pressure of the primary pressure space is higher than the secondary pressure of the treatment chamber housing 33X, that is, the spray pressure of the activated gas 7 from the first stage restricting cylinder 13 is higher than the pressure inside the treatment chamber housing 33X, a flow passing through the outlet (orifice outlet) of the first stage restricting cylinder 13 causes a phenomenon called a shock cell structure (shock cell), and the above shock cell structures are periodically observed in a downstream direction. The shock cell structure means a structure of a shock wave in which reflected shock waves RS to be described later are repeatedly obtained at boundary regions JB (Jet Boundary) to be described below.

Such a case where the pressure at the orifice outlet is greater than the pressure inside the treatment chamber housing 33X is called under expansion and the flow expands after passing through the orifice outlet.

When the pressure at the outlet of the orifice is further greater than the pressure of the treatment chamber housing 33X, the gas has not yet sufficiently expanded, so that expansion waves EW (Expansion Waves) are generated from the edge of the outlet of the orifice, and the gas greatly expands to the outside. When the Mach number of the gas is great, the expansion waves EW are reflected by the boundary region JB (Jet Boundary), become compression waves and return to a jet center axis side. Note that the compression wave is a wave whose pressure is higher than a reference value. When the compression wave passes through, the pressure at the point where the compression wave passes rises. The expansion wave means a wave whose pressure is lower than a reference value. When the expansion wave passes through, the pressure at the point where the expansion wave passes lowers.

Thus, when the pressure difference before and after the gas passes through the first stage restricting cylinder 13 is great, the formed compression waves catch up with preceding compression waves to form barrel-shaped barrel shock waves BS (barrel shock). When the pressure difference becomes further greater, the barrel shock waves BS cannot normally intersect on the center axis of the jet, and in the axisymmetric jet, a disk-shaped normal shock wave called a Mach disk MD (Mach shock wave) is formed. The flow behind the Mach disk MD is a subsonic flow. A reflected shock wave RS (Reflection Shock) is generated from the end of the barrel shock wave BS. Note that a triple point TP is a point at which the barrel shock wave BS which is a compression wave, the Mach disk MD, and the reflected shock wave RS intersect.

Figure 20:
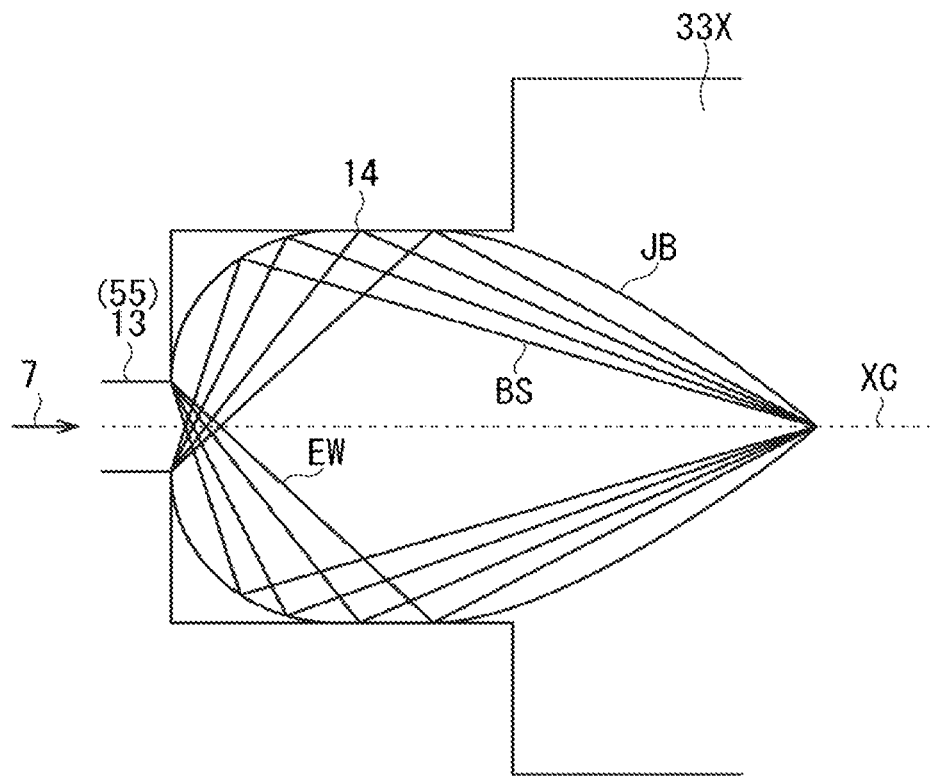
FIG. 20 is an illustration diagram schematically showing an effect when the nozzle constituent part according to the embodiment 1 is used.

In contrast, as shown in FIG. 20, the nozzle constituent part 40 is disposed below the activated gas generating electrode group 301, and the second stage restricting cylinder 14 continuously formed with the first stage restricting cylinder 13 is provided, so that expanded waves EW are reflected by a side surface of the second stage restricting cylinder 14, to allow barrel shock waves BS to normally intersect on a center axis XC of the jet. Therefore, the occurrence of a Mach disk MD can be avoided. In FIG. 20, the presence of the gas jet flow straightener 70 is omitted for convenience of explanation.

(Effects of Nozzle Constituent Part 40 or the Like)

The first stage restricting cylinder 13 (gas spray hole 55) provided above the nozzle part 12 and having the opening having the diameter r1 makes it possible to impart directivity to the activated gas 7 sprayed to the treatment chamber housing 33X, so that the gas can be supplied to the wafer 34 which is the substrate to be treated at an ultra-high speed exceeding Mach.

In this case, due to presence of the second stage restricting cylinder 14 of the nozzle part 12 provided between the first stage restricting cylinder 13 and the treatment chamber housing 33X, it is possible to effectively suppress the occurrence of a Mach disk MD in which the sprayed activated gas 7 is extremely decelerated due to impact pressure and temperature caused by the ultrahigh speed of the sprayed activated gas 7.

Thus, the nozzle constituent part 40 is provided below the activated gas generating electrode group 301, and the film is formed on the surface of the wafer 34 having a high aspect ratio, which makes it possible to exhibit an effect of supplying the activated gas 7 to the wafer 34 stored in the treatment chamber housing 33X via the gas jet flow straightener 70 so that the film having a three-dimensional structure can be formed.

In the activated gas generation apparatus 501 according to the embodiment 1, by setting the pressure ratio PC between the primary pressure inside the generator housing 31X and the secondary pressure inside the treatment chamber housing 33X to 30 times or more, the activated gas 7 can be supplied in a high speed state to the wafer 34 which is a substrate to be treated.

By setting the diameter r2 of the second stage restricting cylinder 14 to be within 30 mm, the nozzle constituent part 40 can more effectively suppress the Mach disk MD.

Figure 21:
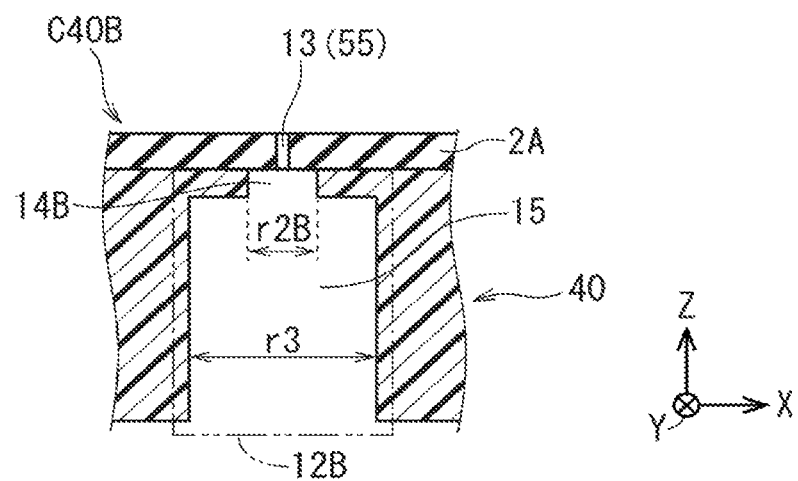
FIG. 21 is a cross-sectional view showing a modified example of the nozzle part.

FIG. 21 is a cross-sectional view showing a modified example of the nozzle part 12. In FIG. 21, an XYZ rectangular coordinate system is shown.

As shown in FIG. 21, the nozzle part 12B of the modified example includes a second stage restricting cylinder 14B (second restricting cylinder) and a third stage restricting cylinder 15 (third restricting cylinder) as main components.

That is, the nozzle part 12B is formed of a configuration including the two restricting cylinder groups 14B and 15.

The first stage restricting cylinder 13, which is the gas spray hole 55 provided in the ground side electrode constituent part 2A, has a circular opening cross-sectional shape with a diameter r1 in plan view, and supplies the activated gas 7 generated in the activated gas generating electrode group 301 downward.

The second stage restricting cylinder 14B is continuously disposed with the first stage restricting cylinder 13 along the Z direction, and has a bottom surface having a circular opening cross-sectional shape with a diameter r2B in plan view. The activated gas 7 supplied from the first stage restricting cylinder 13 is supplied downward. The diameter r2B is set so as to satisfy "r2B>r1". The diameter r2B may be set to be equal to the diameter r1 of the first stage restricting cylinder 13 of the nozzle part 12.

The third stage restricting cylinder 15 is continuously formed with the second stage restricting cylinder 14B along the Z direction, and has a bottom surface having a circular opening cross-sectional shape with a diameter r3 (third diameter) (in plan view) in the XY plane. The activated gas 7 supplied from the second stage restricting cylinder 14B is supplied to the lower gas jet flow straightener 70. The diameter r3 is set so as to satisfy "r3>r2B".

For example, when the diameter r1 of the first stage restricting cylinder 13 is 1.35 mm; the depth is 1 mm; the diameter r2B of the second stage restricting cylinder 14B is 8 mm; and the depth is 4 mm, the diameter r3 of the third stage restricting cylinder 15 is set to 20 mm, and the depth (formation length extending in the Z direction) is set to 46 mm. For example, by supplying nitrogen gas as the activated gas 7 at a flow rate of 4 slm, the activated gas 7 which has passed through the first stage restricting cylinder 13 becomes an ultra-high-speed gas, and is supplied into the gas jet flow straightener 70 via the second stage restricting cylinder 14B and the third stage restricting cylinder 15.

In the nozzle part 12B of the modified example together with the first stage restricting cylinder 13, an activated gas injection combined structure C40B is constituted by the second stage restricting cylinder 14B and the third stage restricting cylinder 15 having the openings having the diameter r2B and the diameter r3, so that directivity can be imparted to the activated gas 7 sprayed to the treatment chamber housing 33X via the gas jet flow straightener 70. In this case, the presence of the second stage restricting cylinder 14B of the nozzle part 12B makes it possible to effectively suppress the Mach disk MD phenomenon.

The nozzle part 12B of the modified example further includes a third stage restricting cylinder 15 in addition to the second stage restricting cylinder 14B, and the diameter r3 of the third stage restricting cylinder 15 is set to be longer than the diameter r2B of the second stage restricting cylinder 14B, so that the activated gas 7 can be supplied to the wafer 34 in the treatment chamber housing 33X in a state where the occurrence of the Mach disc MD caused by the high speed jet generated at the pressure ratio PC is suppressed to be equal to or greater than that in the nozzle part 12.

(Gas Jet Flow Straightener 70)

Figure 22A:
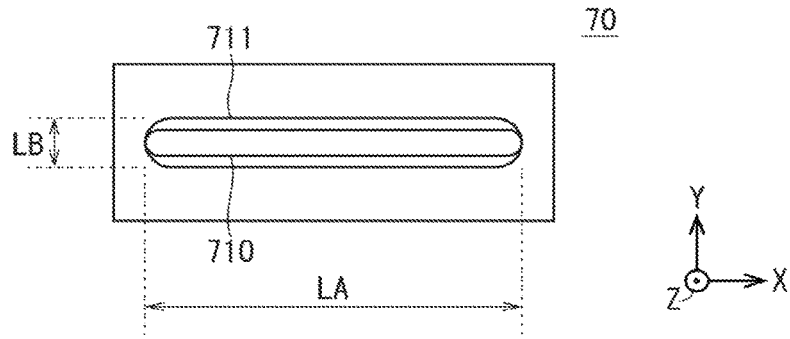
FIGS. 22A to 22C are illustration diagrams showing a configuration of the gas jet flow straightener according to the embodiment 1.
Figure 22B:
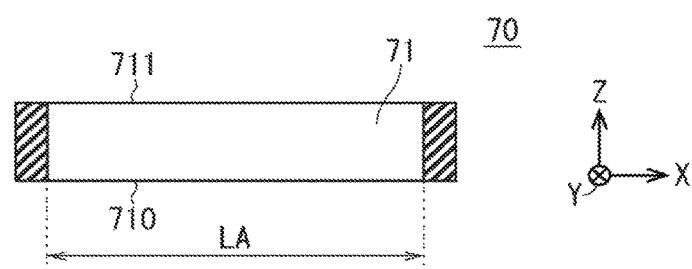
Figure 22C:
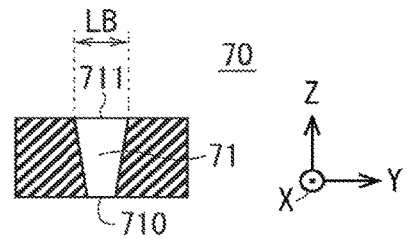

FIGS. 22A to 22C are illustration diagrams showing a configuration of the gas jet flow straightener 70. FIG. 22A is a top view; FIG. 22B is a cross-sectional view showing a cross-sectional structure in the longitudinal direction of FIG. 22A; and FIG. 22C is a cross-sectional view showing a cross-sectional structure in the short direction of FIG. 22A.

Figure 23:
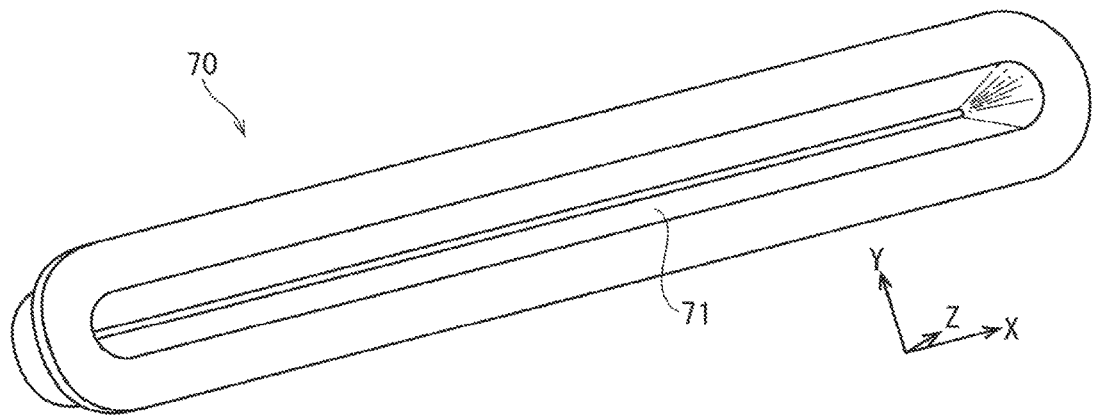
FIG. 23 is a perspective view showing an entire structure of the gas jet flow straightener according to the embodiment 1.

FIG. 23 is a perspective view showing an entire structure of the gas jet flow straightener 70. In FIGS. 22A, 22B, and 23, an XYZ coordinate system is appropriately shown. In FIGS. 22A to 22C, regarding the activated gas generating electrode group 301, the illustrations of metal electrodes 201H and 201L and metal electrodes 101H and 101L are simplistically omitted as appropriate.

As shown in FIGS. 1 to 3, and FIGS. 22A, 22B, and 23, the activated gas 7 passes through the plurality of nozzle parts 12 of the nozzle constituent part 40, and the gas jet flow straightener 70 receives the plurality of nozzle passing gases as a whole at the inlet part 711 of the gas flow-straightening passage 71. The gas jet flow straightener 70 injects the flow-straightened activated gas toward the wafer 34 which is the lower substrate to be treated, from the outlet part 710 according to the flow-straightening action causing the plurality of nozzle passing activated gases to pass through the gas flow-straightening passage 71. In this case, the flow-straightened activated gas is supplied along the direction perpendicular to the wafer 34.

Both the inlet part 711 and the outlet part 710 of the gas flow-straightening passage 71 are opened in a line shape with the X direction as the longitudinal direction and the Y direction as the short direction. In the gas flow-straightening passage 71, the outlet opening area of the outlet part 710 is set to be narrower than the inlet opening area of the inlet part 711, and the cylindrical gas jet of each of the plurality of nozzle passing activated gases is converted into a linear flow-straightened activated gas along the X direction (predetermined direction) according to the flow-straightening action. Specifically, the gas flow-straightening passage 71 has such a shape that the width in the short direction (Y direction) is shorter than a short direction length LB from the inlet part 711 toward the outlet part 710 while the width in the longitudinal direction (X direction) is maintained at a given longitudinal direction length LA.

For this reason, the gas jet flow straightener 70 can inject the linear flow-straightened activated gas having high uniformity toward the wafer 34 which is the substrate to be treated.

Hereinafter, the above effects will be described. The plurality of nozzle passing gases which pass through the plurality of nozzle parts 12 of the nozzle constituent part 40 form gas jet cylinders discretely formed from the gas spray holes 55, and flow in the gas flow-straightening passage 71 of the gas jet flow straightener 70.

The gas jet flow straightener 70 has a structure which is narrower as it goes from the inlet part 711 to the outlet part 710 as described above, so that the plurality of cylinder gas jets are crushed, and spread in the X direction (predetermined direction). Therefore, finally, the linear flow-straightened activated gas is obtained, and sprayed from the outlet part 710.

Therefore, a uniform treatment is performed by eliminating contrasting density generated between the plurality of nozzle passing gases according to the arrangement of the plurality of gas spray holes 55 discretely provided in the activated gas generating electrode group 301. As a result, a uniform film forming treatment can be achieved by the activated gas 7 (flow-straightened activated gas) uniformly sprayed to the wafer 34 which is the substrate to be treated.

From the viewpoint of exhibiting an effect of suppressing the deactivation of nitrogen-based radicals as the activated gas, the gas jet flow straightener 70 is desirably made of quartz, and more desirably alumina, aluminum, or an aluminum alloy. Considering that quartz is expensive and bothersome in treating, an aluminum alloy is easiest to treat. There may be used a metal material having a surface to which a glass lining treatment or ceramic coating is applied.

In order to exhibit the above effect, a gas contact region (the surface region of the gas flow-straightening passage 71), which is a region in contact with the activated gas 7, in the gas jet flow straightener 70 is desirably formed by using quartz or an alumina material as a constituent material.

The outlet opening area of the outlet part 710 is narrower than the inlet opening area of the inlet part 711 of the gas jet flow straightener 70. However, as shown in FIG. 22B, the length in the X direction which is the longitudinal direction is set to the same longitudinal direction length LA. As shown in FIG. 22C, the length in the Y direction, which is the short direction, is shorter from the inlet part 711 to the outlet part 710.

Therefore, the longitudinal direction length LA is caused to coincide with the formation length of the wafer 34, and while the generator housing 31X of the activated gas generation apparatus 501 is moved along the Y direction with respect to the wafer 34, the activated gas 7 is supplied as the flow-straightened activated gas from the gas flow-straightening passage 71, so that the activated gas 7 can be supplied to the entire wafer 34. In a state where the generator housing 31X is fixed, the wafer 34 may be moved.

The gas flow-straightening passage 71 of the gas jet flow straightener 70 supplies the flow-straightened activated gas along the direction perpendicular to the wafer 34 which is the substrate to be treated, so that the flow-straightened activated gas can be supplied to the wafer 34 in a highly uniform state.

Since the activated gas generating electrode group 301 in the activated gas generation apparatus 501 according to the embodiment 1 has the plurality of gas spray holes each serving as the first restricting cylinder having the diameter r1, directivity can be imparted to the generated activated gas, as a result of which the activated gas can be supplied at an ultrahigh speed exceeding Mach. In this case, the presence of the second restricting cylinder 14 of the nozzle part 12 provided downstream of the first stage restricting cylinder 13 (gas spray hole 55) makes it possible to suppress a Mach disk phenomenon which causes the extreme deceleration of the sprayed activated gas depending on the impact pressure and the temperature state caused by the ultrahigh speed of the activated gas passing through the first restricting cylinder 13.

In addition, in the gas flow-straightening passage 71, the outlet opening area of the outlet part 710 is set to be narrower than the inlet opening area of the inlet part 711, and the cylindrical gas jet of each of the plurality of nozzle passing activated gases passing through the nozzle constituent part 40 is converted into the liner flow-straightened activated gas along the X direction (predetermined direction) according to the flow-straightening action causing the plurality of nozzle passing activated gases to pass through the gas flow-straightening passage 71. For this reason, the gas jet flow straightener 70 makes it possible to spray the linear flow-straightened activated gas having high uniformity toward the wafer 34 which is the substrate to be treated.

It is desirable that the source gas 6 of the activated gas 7 be a gas containing at least nitrogen, oxygen, fluorine, and hydrogen gas. In this case, the activated gas generation apparatus can be used not only for formation of an insulating film such as a nitride film or an oxide film, but also for resist peeling and surface treatment of the wafer 34 having a high aspect ratio using an activated gas of a fluorinated gas as an etching gas or a cleaning gas. Furthermore, by applying an ultra-high-speed gas such as a hydrogen radical gas to the surface of the wafer 34, the activated gas 7 usable for applications other than insulating film formation, an etching treatment, and a cleaning function can also be supplied. Therefore, the gas supply apparatus can be used for various film formation treatments.

Embodiment 2

Figure 24:
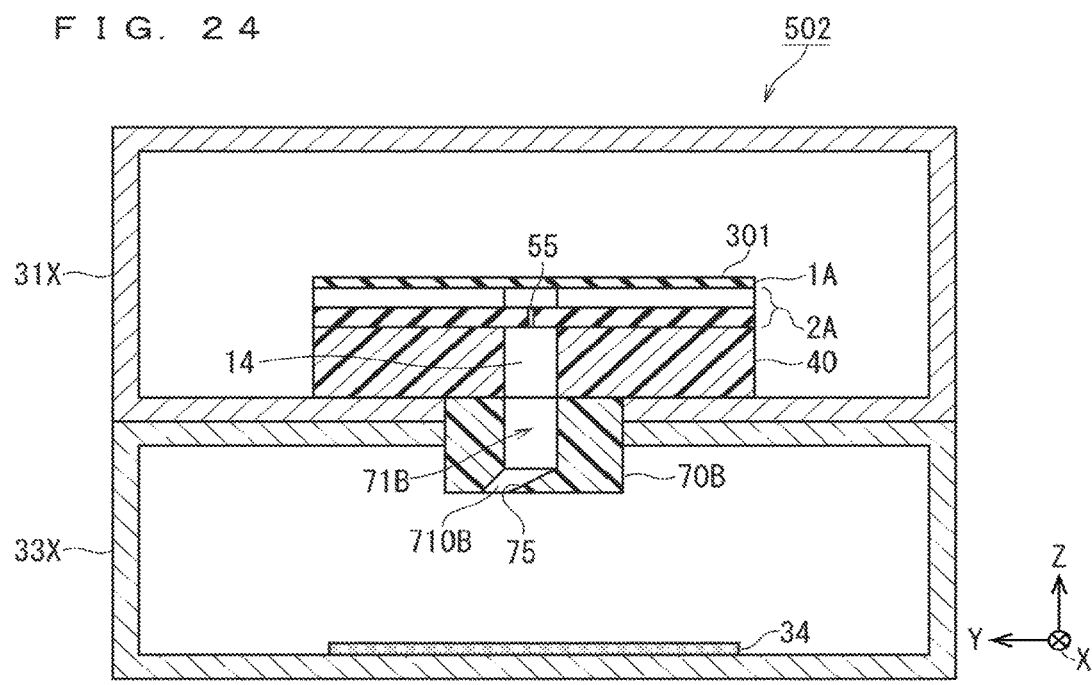
FIG. 24 is an illustration diagram schematically showing a cross-sectional structure of an activated gas generation apparatus according to an embodiment 2 of the present invention.

FIG. 24 is an illustration diagram schematically showing a cross-sectional structure of an activated gas generation apparatus 502 according to an embodiment 2 of the present invention. FIG. 24 is a cross-sectional view taken along a Y direction, and the cross-sectional direction of FIG. 24 is different from that of the cross-sectional view of FIG. 3 which is a cross-sectional view taken along an X direction. That is, FIG. 24 is a cross-sectional view taken along the Y direction forming 90 degrees with the X direction which is an arrangement direction in which a plurality of gas spray holes 55 are formed.

Figure 25:
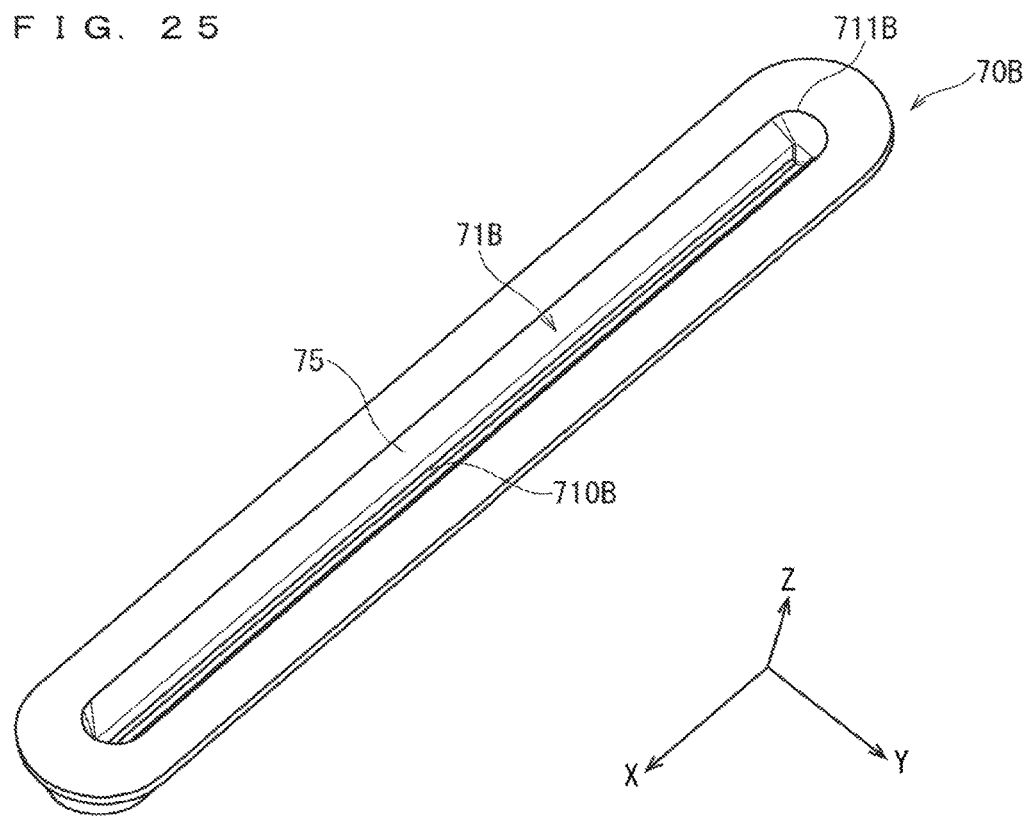
FIG. 25 is a perspective view (part 1) showing an overall configuration of a gas jet flow straightener according to the embodiment 2.
Figure 26:
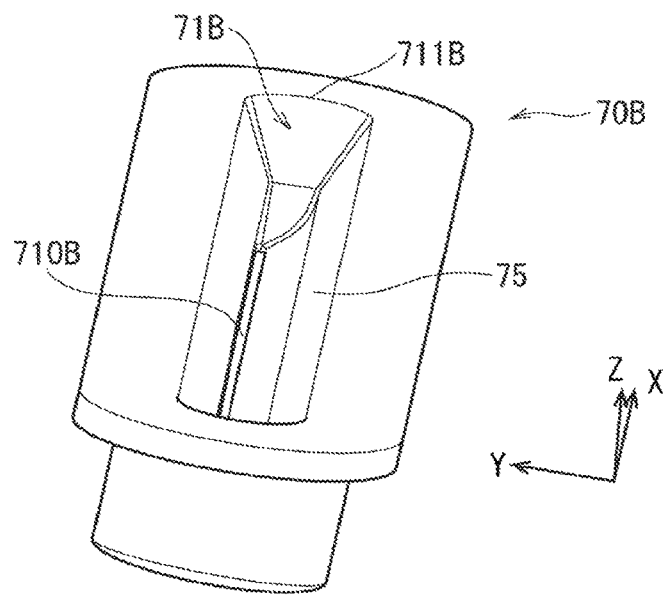
FIG. 26 is a perspective view (part 2) showing the overall configuration of the gas jet flow straightener according to the embodiment 2.
Figure 27:
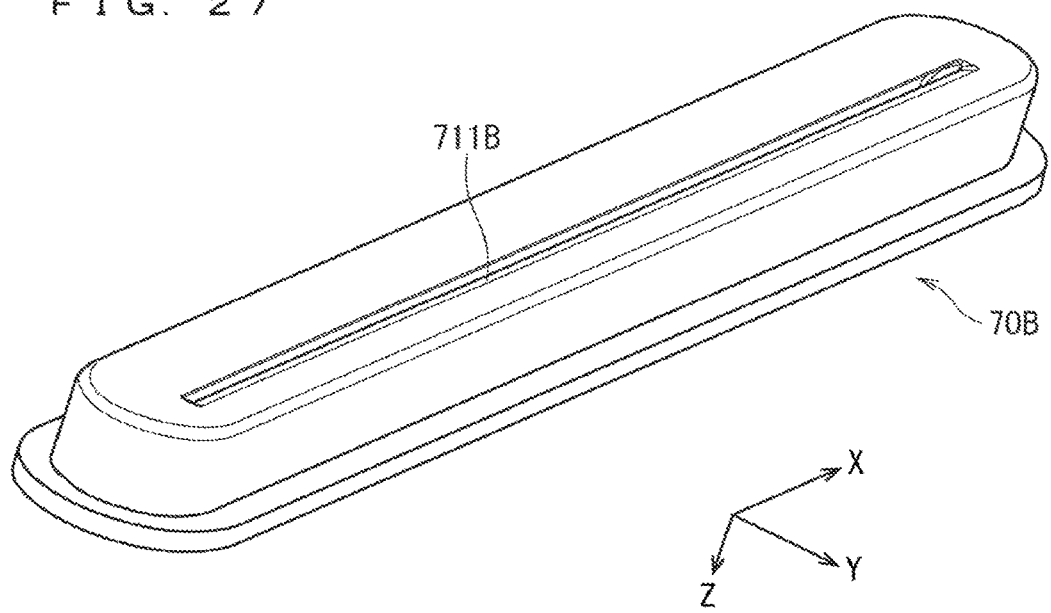
FIG. 27 is a perspective view (part 3) showing the overall configuration of the gas jet flow straightener according to the embodiment 2.

FIGS. 25 to 27 are perspective views showing an entire configuration of a gas jet flow straightener 70B. FIGS. 25 and 26 are views as viewed at angles changed from the upper side (+Z direction), and FIG. 27 is a view as viewed from the lower side (−Z direction).

The activated gas generation apparatus 502 is different from the activated gas generation apparatus 501 of the embodiment 1 in that the gas jet flow straightener 70B is provided in place of a gas jet flow straightener 70. Since the other configurations are the same as those of the activated gas generation apparatus 501, the same reference numerals are given, and the explanation will be appropriately omitted.

As shown in these figures, both an inlet part 711B and an outlet part 710B of a gas flow-straightening passage 71B of the gas jet flow straightener 70B are opened in a line shape with the X direction as a longitudinal direction. As in the gas flow-straightening passage 71, the outlet opening area of the outlet part 710B of the gas flow-straightening passage 71B is set to be narrower than the inlet opening area of the inlet part 711B, and the cylindrical gas jet of each of a plurality of nozzle passing activated gases is converted into a linear flow-straightened activated gas along the X direction (predetermined direction) according to the flow-straightening action.

Therefore, as with the gas jet flow straightener 70, the gas jet flow straightener 70B can spray the linear flow-straightened activated gas having high uniformity toward a wafer 34 which is a substrate to be treated.

Furthermore, the gas flow-straightening passage 71B provided in the gas jet flow straightener 70B has a structure in which the direction of the outlet part 710B is inclined in an oblique direction. That is, the gas jets of the nozzle passing gases which have entered the gas flow-straightening passage 71B vertically from a nozzle constituent part 40 collide with a direction regulating surface 75 provided in the gas flow-straightening passage 71B, so that the direction of the gas jets is changed to a +Y direction, and the cylindrical gas jets are simultaneously deformed, and proceed to the outlet part 710B. The gas jets which have been clearly separated individually are easily reformed in the gas flow-straightening passage 71B by the deformation, which makes it possible to change the jets to a line state.

The shape of the direction regulating surface 75 is not limited to a straight inclined surface, and may be a circular shape or an elliptical shape. However, a shape configuration is desirable, in which about half or more of the cross-section of the plurality of cylindrical nozzle passing gases via the nozzle constituent part 40 is in contact with the direction regulating surface 75.

As described above, the gas flow-straightening passage 71B of the gas jet flow straightener 70B in the activated gas generation apparatus 502 according to the embodiment 2 is provided so as to supply the flow-straightened activated gas not along a direction perpendicular to the wafer 34 but along an oblique direction having a predetermined angle from the perpendicular direction.

The activated gas generation apparatus 502 according to the embodiment 2 supplies the flow-straightened activated gas along a direction oblique to the wafer 34 which is a substrate to be treated, so that the activated gas generation apparatus 502 can exhibit an effect of supplying the flow-straightened activated gas in a wider region with respect to the substrate to be treated without largely impairing uniformity.

Embodiment 3

Figure 28A:
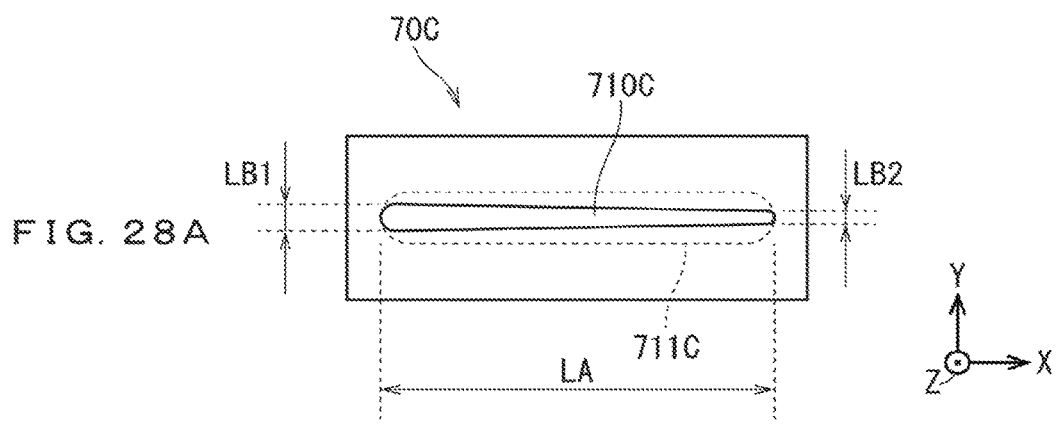
FIGS. 28A to 28C are illustration diagrams showing a configuration of a gas jet flow straightener of an activated gas generation apparatus according to an embodiment 3 of the present invention.
Figure 28B:
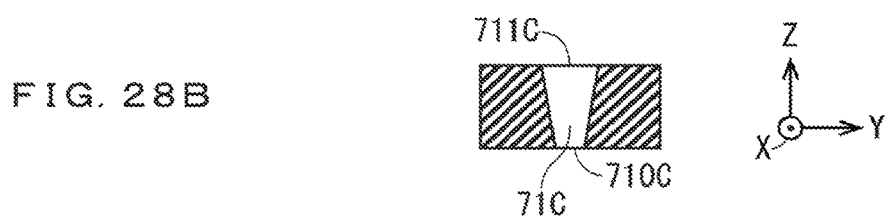
Figure 28C:
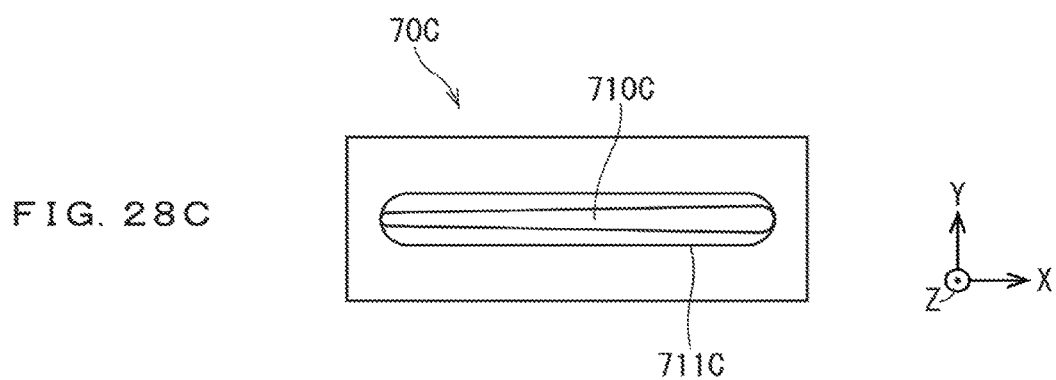

FIGS. 28A to 28C are illustration diagrams showing a configuration of a gas jet flow straightener 70C of an activated gas generation apparatus 503 according to an embodiment 3 of the present invention. FIG. 28A is a bottom view, FIG. 28B is a cross-sectional view showing a cross-sectional structure in a short direction length LB of FIG. 28A, and FIG. 28C is a top view. In FIGS. 28A to 28C, an XYZ coordinate system is appropriately shown.

The activated gas generation apparatus 503 of the embodiment 3 is different from the activated gas generation apparatus 501 of the embodiment 1 in that a gas jet flow straightener 70C is provided in place of a gas jet flow straightener 70. Therefore, the overall configuration is the same as that of the activated gas generation apparatus 501 of the embodiment 1 shown in FIGS. 1 to 3 except that the gas jet flow straightener 70 is replaced by the gas jet flow straightener 70C.

As with the gas jet flow straighteners 70 and 70B, also in the gas jet flow straightener 70C according to the embodiment 3, the outlet opening area of an outlet part 710C is narrower than the inlet opening area of an inlet part 711C of the gas jet flow straightener 70C, and a length in an X direction which is a longitudinal direction is set to be the same. As shown in FIG. 28B, a length in a Y direction which is a short direction is shorter from the inlet part 711C to the outlet part 710C.

That is, the outlet part 710C of a gas flow-straightening passage 71C has an opening shape with the X direction as the longitudinal direction and the Y direction intersecting perpendicularly with the longitudinal direction as the short direction.

Therefore, as with the gas jet flow straightener 70, the gas jet flow straightener 70C injects flow-straightened activated gas along a direction perpendicular to a wafer 34 which is a lower substrate to be treated, from the outlet part 710C according to a flow-straightening action causing the plurality of nozzle passing activated gases to pass through the gas flow-straightening passage 71C.

Furthermore, as shown in FIGS. 28A and 28C, in the outlet part 710 C of the gas jet flow straightener 70C, a formation width in the Y direction which is the short direction changes to be shorter along the X direction which is the longitudinal direction.

That is, the outlet part 710C is formed so that a short direction length LB1 which is a formation width in a Y direction of an end part in a −X direction and a short direction length LB2 which is a formation width in a Y direction of an end part in a +X direction satisfy {LB1>LB2}.

Since the gas flow-straightening passage 71C of the gas jet flow straightener 70C is formed as described above, the activated gas generation apparatus 503 of the embodiment 3 can supply the flow-straightened activated gas to the wafer 34 which is the substrate to be treated while changing the degree of supply of the flow-straightened activated gas along the longitudinal direction (X direction).

A structure can also be achieved, in which the gas jet flow straightener 70C of the embodiment 3 is combined with the gas jet flow straightener 70B of the embodiment 2. That is, it is also possible to achieve the gas jet flow straightener including both the outlet part 710C having the formation width in the short direction changes to be shorter along the longitudinal direction and the gas flow-straightening passage 71B which supplies the flow-straightened activated gas along a direction oblique to the wafer 34 which is the substrate to be treated.

While the present invention has been described in detail, the foregoing description is in all aspects illustrative, and the present invention is not limited thereto. It is understood that numerous modifications not illustrated can be devised without departing from the scope of the present invention.

The invention claimed is:

1. An activated gas generation apparatus comprising:
a substrate accommodating part for accommodating a substrate to be treated;
an activated gas generating electrode group including first and second electrode constituent parts and spraying an activated gas obtained by utilizing a discharge phenomenon from a source gas from a plurality of gas spray holes discretely formed in said second electrode constituent part, each of said plurality of gas spray holes functioning as a first restricting cylinder formed in a circular opening cross-sectional shape with a first diameter in plan view; and said first diameter being set so that a pressure difference between a primary pressure before passing through said gas spray holes and a secondary pressure after passing is equal to or higher than a predetermined pressure ratio;
a nozzle constituent part including a plurality of nozzle parts provided to correspond to said plurality of gas spray holes of said activated gas generating electrode group one-on-one, each of the nozzle parts causing the activated gas sprayed from each of said plurality of gas spray holes to pass therethrough, to obtain a nozzle passing activated gas; and
a gas jet flow straightener including an inlet part receiving the plurality of nozzle passing activated gases passing through said nozzle constituent part, and injecting the flow-straightened activated gas toward said substrate to be treated, from an outlet part according to a flow-straightening action causing said plurality of nozzle passing activated gases to pass through gas flow-straightening passages, wherein
each of said plurality of nozzle parts includes a second restricting cylinder formed in a circular opening cross-sectional shape with a second diameter in plan view and supplying the activated gas supplied from said first restricting cylinder toward said gas jet flow straightener;
said second diameter is set to be longer than said first diameter, and said nozzle passing activated gases are cylindrical gas jets; and said gas flow-straightening passage is formed so that an outlet opening area of said outlet part is set to be narrower than an inlet opening area of said inlet part, and cylindrical gas jets of said plurality of nozzle passing activated gases are converted into said linear flow-straightened activated gas along a predetermined direction by said flow-straightening action.

2. The activated gas generation apparatus according to claim 1,
wherein said gas flow-straightening passage is provided so that said flow-straightened activated gas is supplied along a direction perpendicular to said substrate to be treated.

3. The activated gas generation apparatus according to claim 1,
wherein said gas flow-straightening passage is provided so that said flow-straightened activated gas is supplied along an oblique direction having a predetermined inclination from a direction perpendicular to said substrate to be treated.

4. The activated gas generation apparatus according to claim 1, wherein
said outlet part of said gas flow-straightening passage has an opening shape with said predetermined direction as a longitudinal direction, and a direction perpendicularly crossing to said longitudinal direction as a short direction; and
said outlet part is formed so that a formation width of said short direction changes along said longitudinal direction.

5. The activated gas generation apparatus according to claim 1,
wherein a gas contact region which is a region in contact with a gas in said gas jet flow straightener is formed of quartz or an alumina material as a constituent material.

6. The activated gas generation apparatus according to claim 1,
wherein said source gas is a gas containing at least nitrogen, oxygen, fluorine, and hydrogen.

7. The activated gas generation apparatus according to claim 1, wherein
in said activated gas generating electrode group, said second electrode constituent part is provided below said first electrode constituent part, and by applying an AC voltage to said first and second electrode constituent parts, a discharge space is formed between said first and second electrode constituent parts, and by activating a source gas supplied to said discharge space, an activated gas is generated;
said first electrode constituent part includes a first dielectric electrode and a first metal electrode selectively formed on an upper surface of said first dielectric electrode, said second electrode constituent part includes a second dielectric electrode and a second metal electrode selectively formed on a bottom surface of said second dielectric electrode, and in a dielectric space where said first and second dielectric electrodes face each other by an application of said AC voltage, a region where said first and second metal electrodes overlap each other in plan view is defined as said discharge space;
said second metal electrode includes a pair of second partial metal electrodes formed so as to face each other with a central region of said second dielectric electrode interposed therebetween in plan view, and said pair of second partial metal electrodes have a first direction as an electrode formation direction and a second direction intersecting with said first direction, said pair of second partial metal electrodes facing each other in the second direction, said predetermined direction being said first direction;
said first metal electrode includes a pair of first partial metal electrodes including a region overlapping with said pair of second partial metal electrodes in plan view;
said second dielectric electrode includes
said plurality of gas spray holes formed in said central region and formed along said first direction, and
a central region step part formed so as to protrude upward in said central region; and
said central region step part is formed so as to have a shorter formation width in said second direction as approaching said plurality of gas spray holes in plan view without overlapping with said plurality of gas spray holes in plan view.

* * * * *